(12) United States Patent
Agarwal et al.

(10) Patent No.: US 11,989,834 B1
(45) Date of Patent: May 21, 2024

(54) THREE-DIMENSIONAL ROOM MODELING

(71) Applicant: Amazon Technologies, Inc., Seattle, WA (US)

(72) Inventors: Mukul Agarwal, San Francisco, CA (US); Asfand Yar Khan, Redmond, WA (US); Tomas F. Yago Vicente, Caspe (ES); Divyansh Agarwal, Sunnyvale, CA (US); Karl Hillesland, San Carlos, CA (US); Kevin May, Oakland, CA (US); Yu Lou, Palo Alto, CA (US); Chun-Kai Wang, Sunnyvale, CA (US)

(73) Assignee: Amazon Technologies, Inc., Seattle, WA (US)

( * ) Notice: Subject to any disclaimer, the term of this patent is extended or adjusted under 35 U.S.C. 154(b) by 62 days.

(21) Appl. No.: 17/832,120

(22) Filed: Jun. 3, 2022

(51) Int. Cl.
*G06T 17/20* (2006.01)
*G06F 30/13* (2020.01)
*G06T 19/20* (2011.01)

(52) U.S. Cl.
CPC ............ *G06T 17/205* (2013.01); *G06F 30/13* (2020.01); *G06T 19/20* (2013.01); *G06T 2219/028* (2013.01)

(58) Field of Classification Search
CPC ........ G06T 17/205; G06T 19/20; G06F 30/13
See application file for complete search history.

(56) References Cited

U.S. PATENT DOCUMENTS

| | | | |
|---|---|---|---|
| 2021/0279950 A1* | 9/2021 | Phalak | G06T 7/55 |
| 2022/0375170 A1* | 11/2022 | Osokin | G06F 30/13 |
| 2023/0196670 A1* | 6/2023 | Su | G06T 7/62 |
| | | | 345/419 |

* cited by examiner

*Primary Examiner* — Samantha (Yuehan) Wang
(74) *Attorney, Agent, or Firm* — K&L Gates LLP

(57) ABSTRACT

Devices and techniques are generally described for three dimensional room modeling. In various examples, 3D mesh data representing a room may be received. Plane data comprising a plurality of planes may be received. Each plane of the plurality of planes may represent a planar surface detected in the room. In some cases, a first plurality of wall candidates for a 3D model of the room may be determined based at least in part on the plane data. A second plurality of wall candidates for the 3D model of the room may be determined by modifying the first plurality of wall candidates based on a comparison of the first plurality of wall candidates to the 3D mesh data. The 3D model of the room may be generated based at least in part on the second plurality of wall candidates.

18 Claims, 15 Drawing Sheets

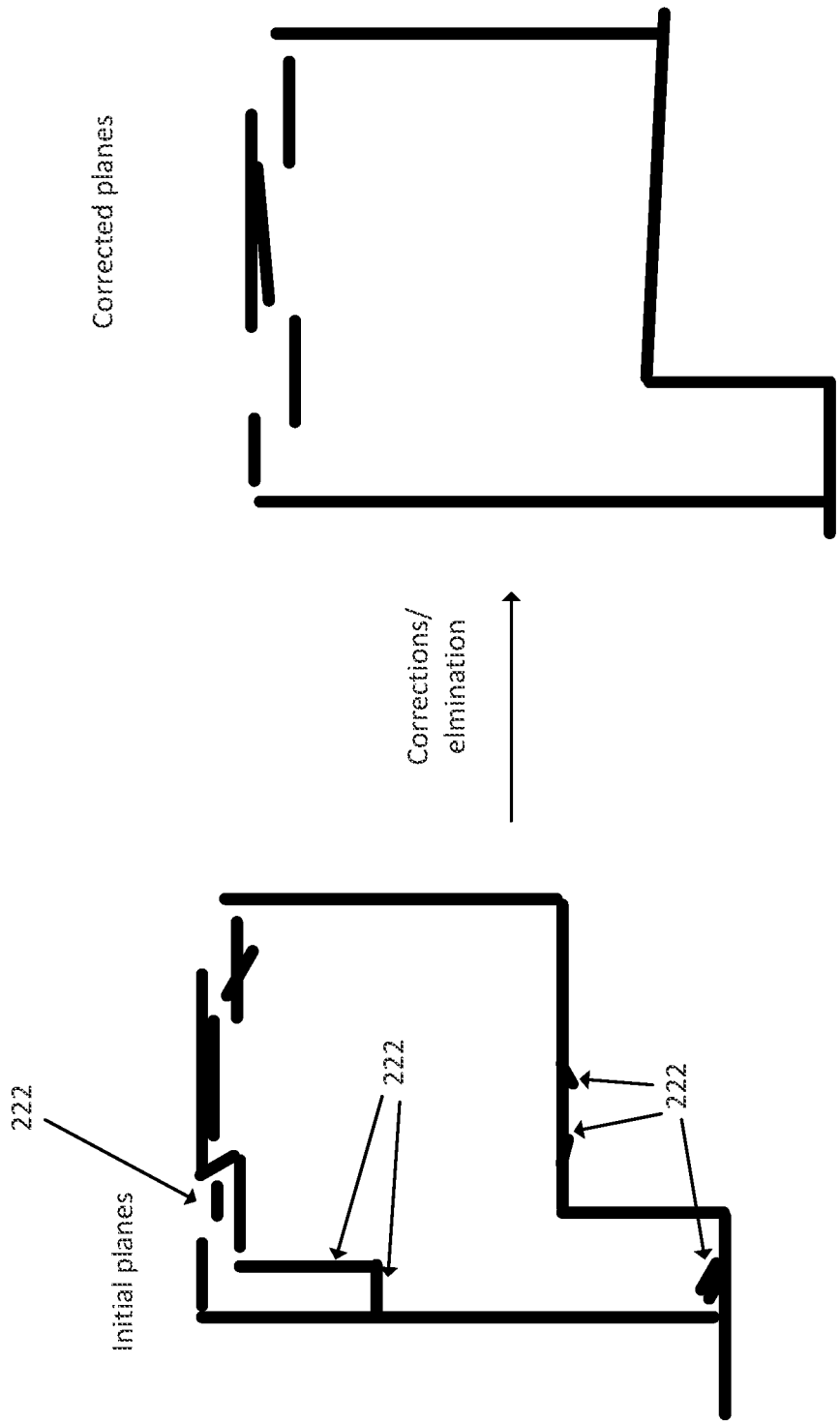

THREE-DIMENSIONAL ROOM MODELING

BACKGROUND

Accurately estimating three-dimensional ("3D") models from two-dimensional ("2D") input images is referred to as 3D modeling. Various modeling applications may be effective to generate 3D meshes including vertices and edges defining outer boundaries of a 3D object. Additionally, 3D modeling software may generate planes and/or polygons representing surfaces detected in a physical environment using various sensors.

BRIEF DESCRIPTION OF DRAWINGS

FIG. 2C represents a top-down view of initial candidate wall planes, in accordance with various aspects of the present disclosure.

FIG. 2D represents corrected candidate wall planes, in accordance with various aspects of the present disclosure.

DETAILED DESCRIPTION

Figure 1:
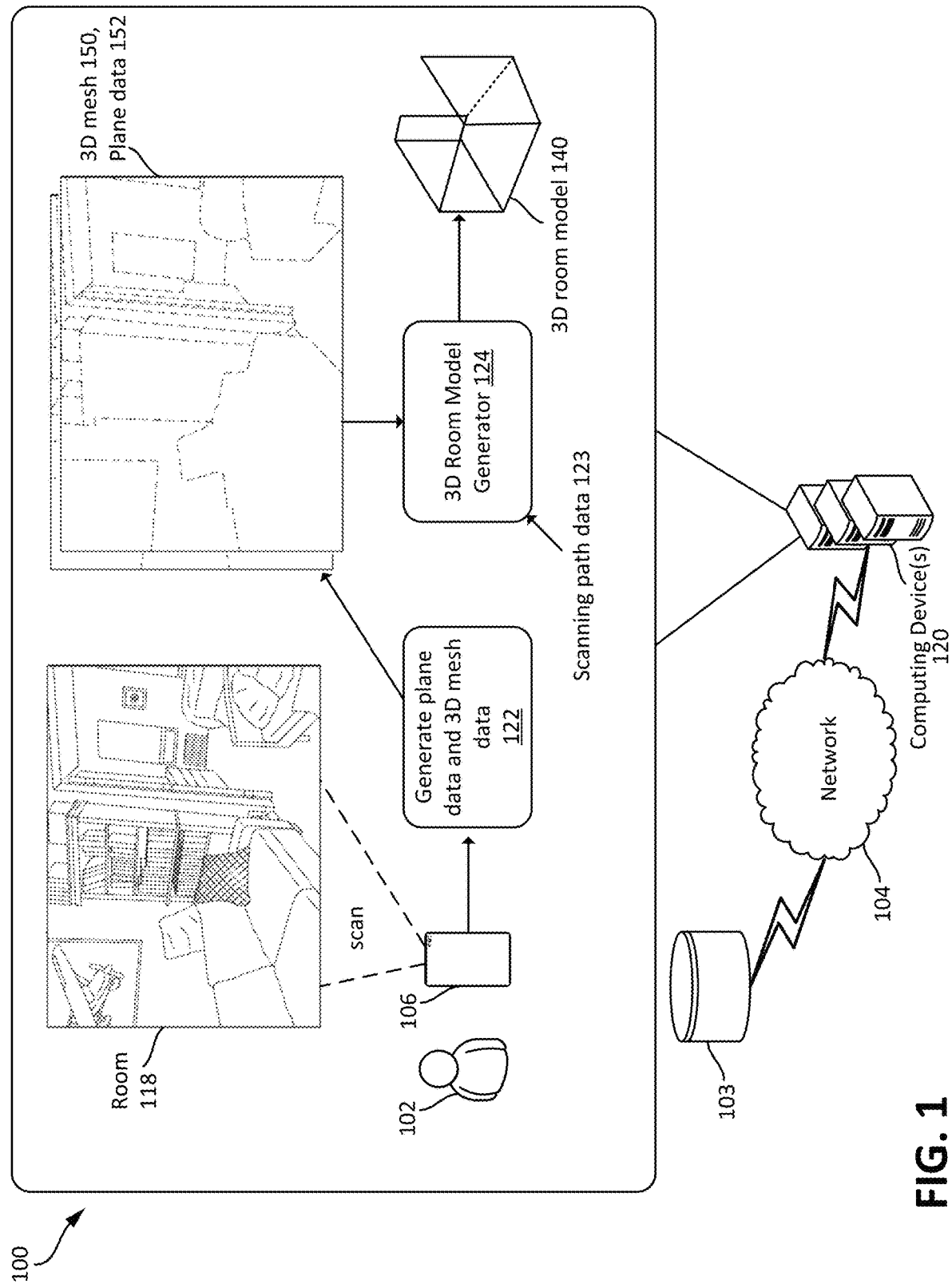
FIG. 1 is a diagram of an example 3D room modeling system, according to various aspects of the present disclosure.

In the following description, reference is made to the accompanying drawings that illustrate several examples of the present invention. It is understood that other examples may be utilized and various operational changes may be made without departing from the scope of the present disclosure. The following detailed description is not to be taken in a limiting sense, and the scope of the embodiments of the present invention is defined only by the claims of the issued patent.

Various computer modeling techniques may be used for three dimensional (3D) modeling of physical spaces such as rooms in a house or other building. In many cases, 3D room models resulting from such computer modeling may result in various inaccuracies, such as planar walls that do not meet and/or models that fail to account for features such as half walls, windows, doors, wall openings, etc. Various 3D room modeling techniques are described herein that generate accurate 3D models of rooms from user scans regardless of whether the room is furnished or not. In various examples, the 3D room modeling systems described herein use semantic understandings of various surfaces detected in the room to perform a variety of processing steps resulting in an accurate 3D model of the room. The 3D models of the room may be used for interior design and/or for mapping a physical space. For example, a 3D room model may be used to try out various furnishings to see how they might appear within the room, without requiring that the furnishings actually be placed within the room. Additionally, in various examples described herein, the 3D room modeling system may detect doors, windows, fireplaces, wall openings, and other real-world room features and may include representations of such features in the 3D room model. Such features (e.g., doors, windows, etc.) may be automatically detected during modeling. A user interface may be provided to enable a user to correct the placement, size, and/or shape of a door, window, wall opening, and/or other room feature. For example, the predicted feature type (e.g., door) may be overlaid in a semi-transparent layer over a real image of the room during scanning to allow the user to modify the size and/or shape of the virtual door to be commensurate with the real-world door. Further, the interface may enable the user to change the type of room feature detected in the event that the 3D room modeling system has predicted an incorrect room feature (e.g., enabling the user to change the predicted feature type "door" to the feature type "window"). Various other features of the 3D room modeling system are described in further detail below.

Machine learning techniques are often used to form predictions, solve problems, recognize objects in image data for classification, etc. In various examples, machine learning models may perform better than rule-based systems and may be more adaptable as machine learning models may be improved over time by retraining the models as more and more data becomes available. Accordingly, machine learning techniques are often adaptive to changing conditions. Deep learning algorithms, such as neural networks, are often used to detect patterns in data and/or perform tasks.

Generally, in machine learned models, such as neural networks, parameters control activations in neurons (or nodes) within layers of the machine learned models. The weighted sum of activations of each neuron in a preceding layer may be input to an activation function (e.g., a sigmoid function, a rectified linear units (ReLu) function, etc.). The result determines the activation of a neuron in a subsequent layer. In addition, a bias value can be used to shift the output of the activation function to the left or right on the x-axis and thus may bias a neuron toward activation.

Generally, in machine learning models, such as neural networks, after initialization, annotated training data may be used to generate a cost or "loss" function that describes the difference between expected output of the machine learning model and actual output. The parameters (e.g., weights and/or biases) of the machine learning model may be updated to minimize (or maximize) the cost. For example, the machine learning model may use a gradient descent (or ascent) algorithm to incrementally adjust the weights to cause the most rapid decrease (or increase) to the output of the loss function. The method of updating the parameters of the machine learning model may be referred to as back propagation.

FIG. 1 is a diagram of an example 3D room modeling system 100, according to various aspects of the present disclosure. Computing device(s) 120 may include non-transitory computer-readable memory 103 and/or may be configured in communication with non-transitory computer-readable memory 103, such as over network 104. In various examples, network 104 may represent a local area network (LAN) and/or a wide area network (WAN) such as the internet. In various examples, non-transitory computer-readable memory 103 may store instructions that may be used to implement the 3D room modeling techniques described herein.

A user 102 may possess a mobile device 106 (e.g., a smart phone, tablet device, and/or any other mobile device including a camera and at least one processor). The mobile device 106 may include a light detection and ranging (Lidar) sensor, in addition to an image sensor configured to generate frames of RGB image data. A mobile application may execute on the mobile device 106. The mobile application may enable the user to generate a 3D room model 140 by scanning the desired physical space (e.g., room 118). The mobile application may employ the camera and the Lidar sensor of the mobile device and may provide a visualization of the user (using a live view of the camera feed). The visualization may guide the user 102 through scanning the room to ensure that the user has covered the entire room 118 during the scanning procedure. Various visualizations and/or scanning techniques may be used to ensure that the user has thoroughly scanned the room. The particular visualizations of the mobile application and/or scanning guidance may vary from implementation to implementation.

Figure 2A:
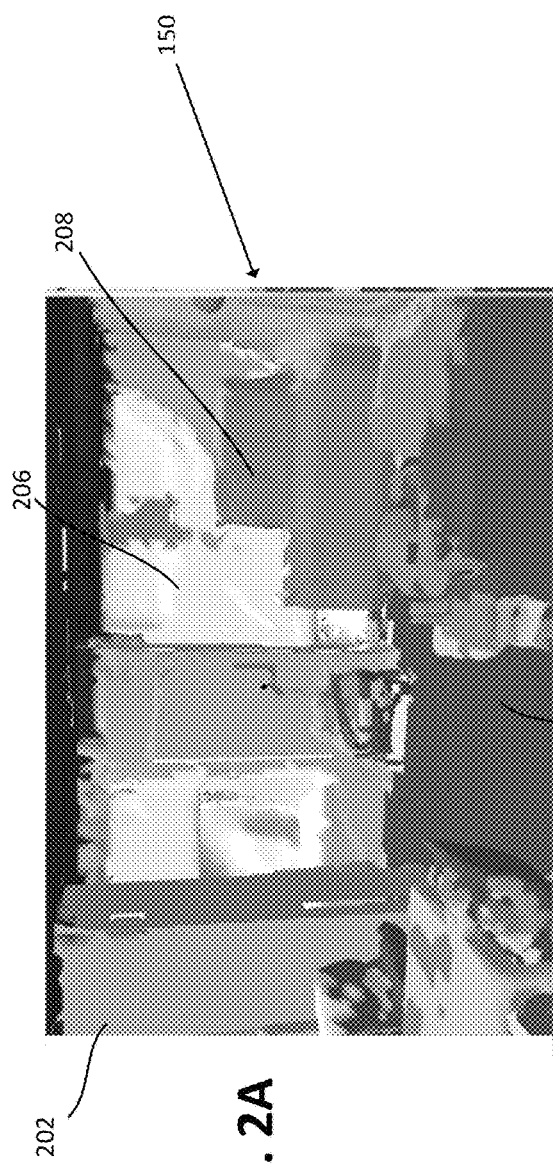
FIG. 2A represents a 3D mesh that may be used as an input to the 3D room model generator of FIG. 1, in accordance with various aspects of the present disclosure.
Figure 2B:
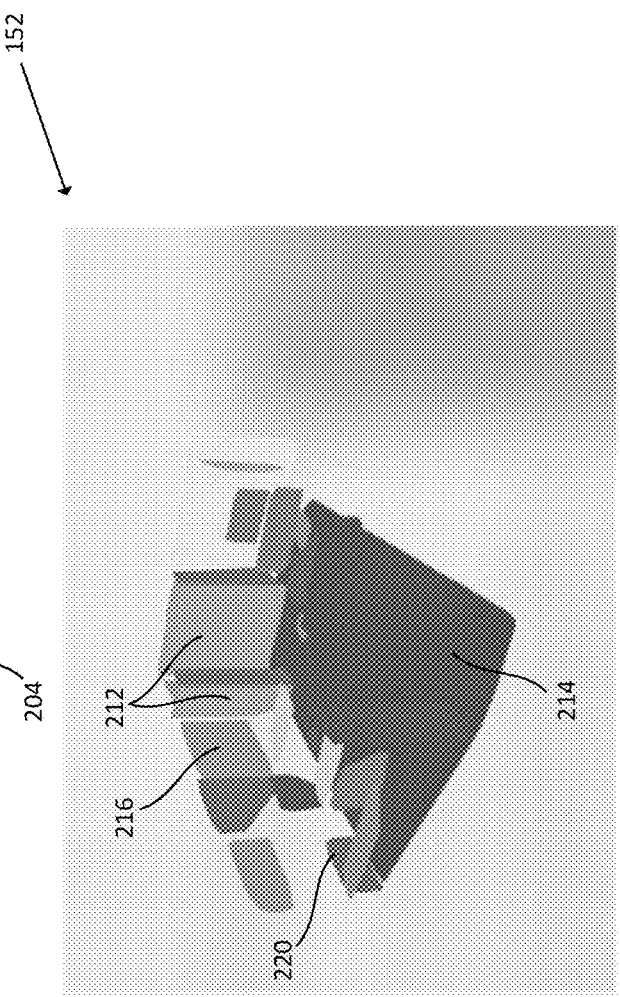
FIG. 2B represents polygons representing detected surfaces that may be used as an input to the 3D room model generator of FIG. 1, in accordance with various aspects of the present disclosure.

The mobile application may use the scanned data to generate plane data and 3D mesh data (block 122) representing the room 118. For example, 3D mesh data 150 and plane data 152 representing room 118 may be generated. 3D mesh data 150 may be a collection of vertices, edges, and faces (e.g., polygons defined by the edges and vertices) that represent physical shapes of room 118. The 3D mesh data 150 may include a depth map (e.g., depth information) and may reflect the relative sizes and distances of and between the various surfaces detected. Plane data 152 may include planes representing one or more planar surfaces detected in the physical environment (e.g., room 118). For example, FIG. 2A represents a 3D mesh 150 that may be used as an input to the 3D room model generator 124 of FIG. 1, in accordance with various aspects of the present disclosure. FIG. 2B represents polygons representing detected surfaces that may be used as an input to the 3D room model generator 124, in various examples. In some examples, the 3D mesh data 150 may be generated from the depth map data output by the Lidar sensor of mobile device 106. Similarly, in various examples, the plane data 152 may be determined using the RGB image data and/or available depth data output by a camera and/or depth sensor of mobile device 106. Plane data 152 and 3D mesh data 150 may be output by one or more software libraries associated with (e.g., configured to process data output by) the Lidar sensor and/or the camera. Plane data 152 may be a combination of vertices and edges that form a connected set of triangular faces. For planes, the vertices, edges, and faces all lie on a flat, planar surface of the same classification (e.g., "wall," "window," "door," "floor," etc.). In 3D mesh data 150, each face of the mesh (formed by various edges and vertices) may have an individual classification.

The various surfaces and/or objects detected in plane data 152 and 3D mesh data 150 may be roughly classified by the mobile application executing on the mobile device 106. For example, a surface determined to be a floor of room 118 may be classified as such. Similarly, surfaces determined to correspond to walls, windows, ceiling, etc., may be classified using label data labeling these surfaces/objects as such. However, such labels may have relatively low accuracy and may include errors in terms of segmentation boundaries (e.g., some pixels/portions of the floor may be segmented as part of the wall and may be labeled as "wall") and/or in terms of classification labels (e.g., a wall may be incorrectly classified as a window). Accordingly, various techniques described in FIGS. 2C-2N may be used by 3D room model generator 124 to refine, correct, and/or otherwise modify the 3D mesh data 150 and/or the plane data 152 to construct an accurate 3D room model 140. The 3D room model 140 may represent only the shell of the room 118 including wall features (such as doors, windows, wall-openings, fireplaces, pictures, etc.), but optionally without furniture that is within the room 118. As such, the 3D room model 140 may be an accurate 3D model of an empty version of the scanned room 118.

For example, in 3D mesh data 150 surface 202 may be classified in the 3D mesh data 150 as a wall surface. Surface 204 may be classified in the 3D mesh data 150 as a floor surface. Surface 206 may be classified as a window. As can be seen in FIG. 2A, the portions of the 3D mesh classified as a window (surface 206) are irregular in shape and are unlikely to correspond to a window in the physical room. Accordingly, the classification of the various surfaces in the 3D mesh data 150 is not completely accurate. In the example 3D mesh data 150, surface 208 may be classified as furniture. Various other classes and/or surface types may be used in the classification of the 3D mesh data.

Similarly, in the plane data 152, polygons 212 may be classified as wall polygons. Polygon 216 may be classified as a window polygon, polygon 214 may be classified as a floor polygon, etc. In various examples, a pre-processing step of 3D room model generator 124 (FIG. 1) may be to perform various corrections and/or other preprocessing on the plane data 152. For example, various polygons may be converted to wall candidate data. For example, polygons labeled as wall polygons (e.g., polygons 212, 220) and window polygons (e.g., polygon 216) may be considered as potential wall candidates. An initial corrective action may be to ensure that all such polygons (e.g., wall polygons and window polygons) are vertically oriented. Accordingly, the angle of some polygons may be corrected to ensure they are vertically oriented (e.g., along the z-axis). Additionally, some wall candidates may not fully extend from the floor to the ceiling. For example, polygon 220 may not extend fully to a ceiling of the plane data 152. Accordingly, the polygon 220 may be extended to meet the ceiling or may be deleted and removed from further consideration, depending on the implementation.

FIG. 2C represents a top-down view of initial candidate wall planes of the plane data 152 prior to corrective pre-processing, in accordance with various aspects of the present disclosure. As shown, various candidate wall planes may be deleted during the corrective pre-processing (e.g., polygons that do not extend fully between the floor plane and the ceiling plane may be deleted). Additionally, candidate wall planes that are below a threshold size (e.g., a threshold area) may be eliminated. In some cases, different types of candidate wall planes may be associated with different size thresholds for elimination. For example, a candidate wall plane classified as a window may have a higher size threshold than a candidate wall plane classified as a wall (e.g., requiring planes classified as windows to be larger than planes classified as walls). Any planes classified as other types of planes (e.g., a plane classified as "furniture") may be eliminated. Accordingly, FIG. 2D represents corrected candidate wall planes, in accordance with various aspects of the present disclosure. As shown, various candidate wall planes 222 have been deleted/eliminated from the candidate wall planes of FIG. 2C to generate the corrected candidate wall planes shown in FIG. 2D.

Figure 2E:
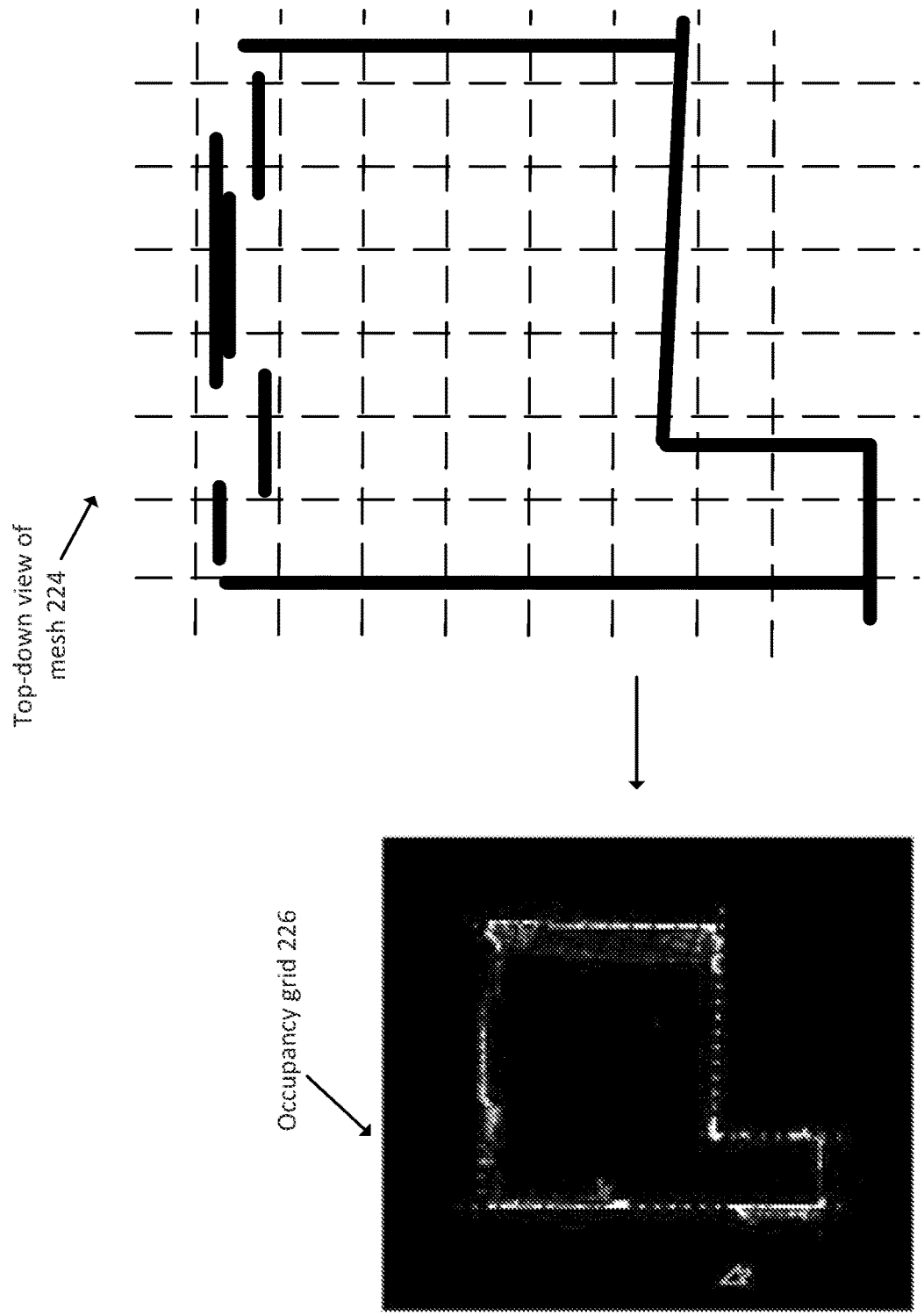
FIG. 2E represents a grid overlaid on top of a top-down view of the 3D mesh data and an occupancy grid that may be used in accordance with various aspects of the present disclosure.

FIG. 2E represents a grid overlaid on top of a top-down view of the 3D mesh data 150 and an occupancy grid 226 that may be used in accordance with various aspects of the present disclosure. Top down view of mesh 224 may be a top-down view of the 3D mesh data 150. Each cell of the grid may correspond to a particular real world measurement. For example, the grid may be comprised of squares with sides of 5.5 cm. This measurement is merely an example, the size of the grid cells may vary from implementation to implementation. Additionally, squares need not be used for grid cells. Any polygon may be used for grid cells.

For each grid cell, 3D room model generator 124 may generate a count corresponding to the number of times a vertical surface of the 3D mesh data 150 is found in the particular cell. Each vertical surface of the 3D mesh data 150 may contribute a different score to a particular cell. For example, the presence of a surface that is classified as a wall surface (e.g., surface 202 in FIG. 2A) within a grid cell may contribute a first score value. The presence of a surface that is classified as a window surface (e.g., surface 206 in FIG. 2A) may contribute a second score value to the grid cell that is lower than the value of a wall surface. The presence of a surface that is classified as a door surface may contribute a third score value to the grid cell which may be lower than the value contributed by a wall surface, and so on. The particular values contributed by each surface type may be tunable parameters and may vary from implementation to implementation. This operation may be performed for every grid cell and may be used to generate occupancy grid 226. Occupancy grid 226 may be conceptually thought of as a heat map, with bright points representing a portion of the mesh data where a wall is likely present (in the corresponding physical room) and dark spots representing a portion of the mesh data where there is unlikely to be a wall present.

In FIG. 1, scanning path data 123 is shown as an input to 3D room model generator 124. The scanning path data 123 refers to the path of the camera taken during the capture of each frame of image data/depth data during the scan of the physical room 118. The scanning path data 123 correlates a position of the camera of the scanning device (e.g., mobile device 106) with a frame of image data/depth data. Accordingly, a path of the camera is represented by the scanning path data 123. An average position of the camera/Lidar sensor during the scanning may be determined from the scanning path data 123. This average position, which may conceptually be thought of as the center scanning position of the camera/Lidar sensor, may be used to weight the scores of the occupancy grid 226. Surfaces that are closer to the center scanning position may be weighted higher (with increased scores) relative to surfaces that are further from the center scanning position. This technique may give higher weights to walls that are in the room being scanned by the user, as opposed to walls that are visible through an opening in the room being scanned.

The occupancy grid 226 may be overlaid on a top-down view of the plane data 152. The wall candidates from among the plane data 152 that align with high scores from the occupancy grid are more likely to be accurate representations of the actual walls of the room 118.

Figure 2F:
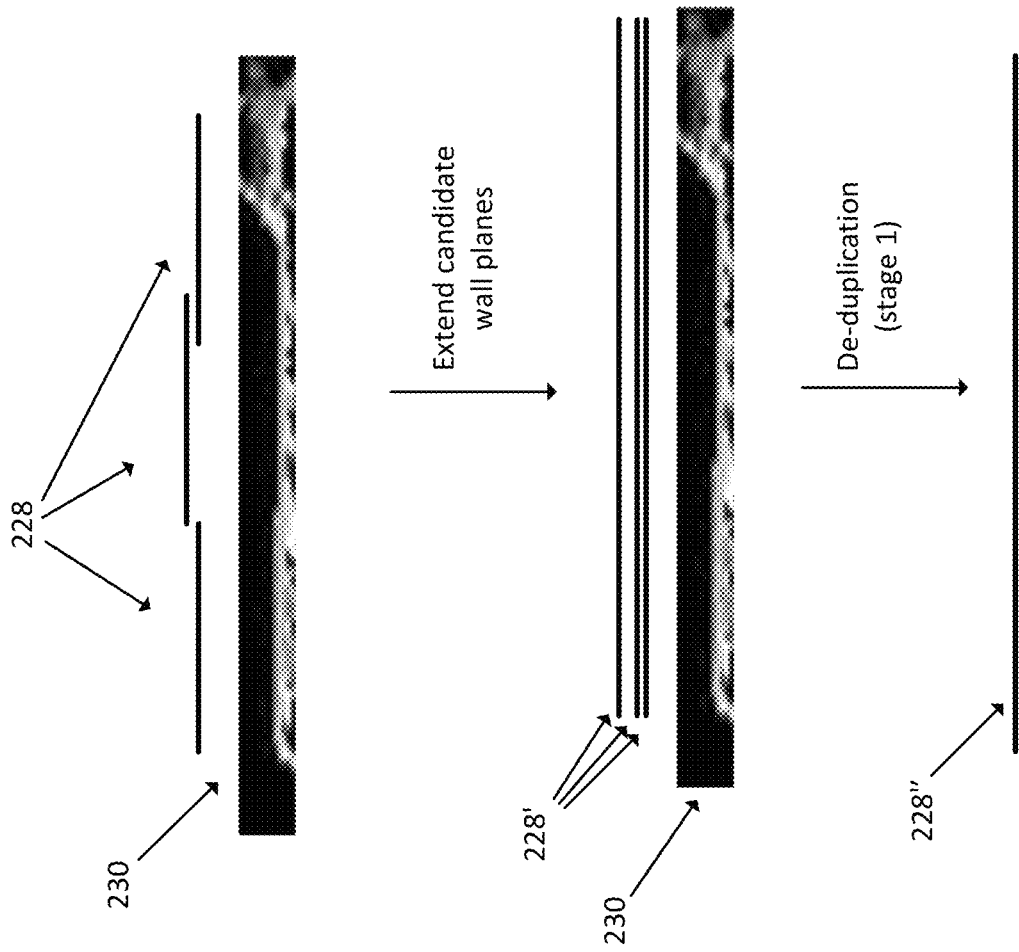
FIG. 2F represents a first deduplication procedure that may be used in accordance with various aspects of the present disclosure.

FIG. 2F illustrates extension of the candidate wall planes (in top-down view) of the plane data 152. Planes 228 represent a top-down view of three candidate planes from plane data 152. A corresponding portion 230 of occupancy grid 226 is depicted below the three planes 228. Although shown in FIG. 2F adjacent to one another (for simplicity of illustration), the portion 230 of the occupancy grid 226 may align with the three planes 228 when the occupancy grid 226 is overlaid over the top-down view of the plane data 152.

The planes 228 may be extended to be commensurate with the length of the corresponding portion 230 of the occupancy grid. In other words, the planes 228 may be extended to be commensurate with an overlapping vertical surface (a vertical surface represented in the occupancy grid 226 that overlaps with one or more planes 228) represented in the heat map of occupancy grid 226. This extension operation is performed as many wall planes/surfaces in the plane data 152 and/or 3D mesh data 150 may be split into various fragments although in reality they represent a single surface. The planes 228 may be incrementally extended until they no longer correspond with the relevant portion 230 of the occupancy grid 226 to generate extended planes 228'.

After performing the extension of all candidate wall planes to be commensurate with the corresponding portion of the occupancy grid 226, first stage deduplication may be performed. The various deduplication stages described herein may be optional. In various examples, one or both may be eliminated, in accordance with the desired implementation. First, each candidate wall plane may be scored by adding the scores for each grid cell through which the candidate wall plane passes. Next, for each pair of extended candidate wall planes, a determination may be made of a distance between the two wall planes, an amount of overlap, and an angle between the two wall planes. If the angle is below an angle threshold (e.g., less than 10% or some other suitable value), the amount of overlap is less than an overlap threshold, and/or the distance is below a distance threshold (e.g., less than 3 grid squares, less than 1 meter, or some other suitable threshold), one of the planes may be removed (e.g., deleted). The 3D room model generator 124 may select the plane with the lowest score for removal. For example, the three extended candidate wall planes 228' may each be separated by a distance that is less than a distance threshold and may be within a threshold angle of one another. However, a first candidate wall plane 228' may have a score of 37, a second candidate wall plane 228' may have a score of 32, and the third candidate wall plane 228' may have a score of 21. Accordingly, the candidate wall planes 228' with scores of 32 and 21 may be deleted, resulting in only a single candidate wall plane 228".

Figure 2H:
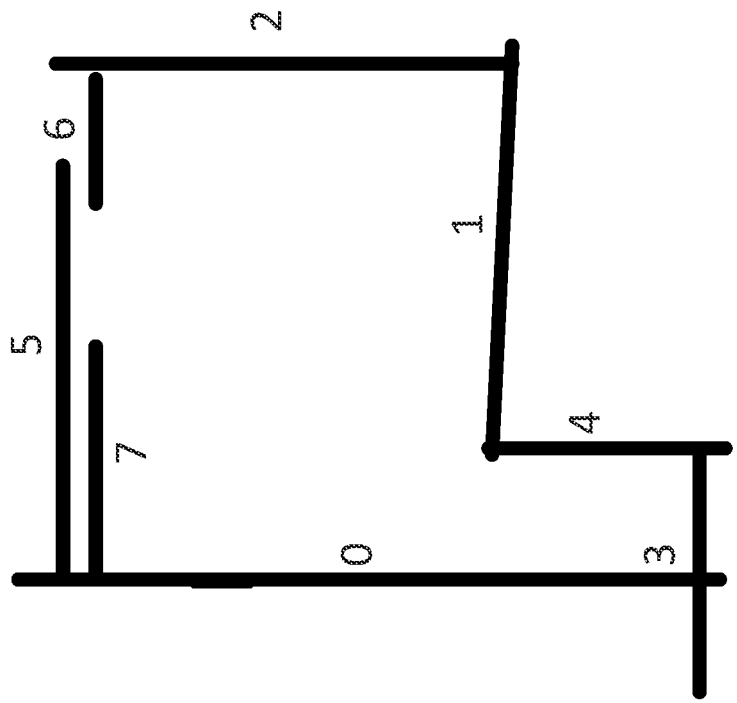
FIG. 2H represents deduplicated extended candidate wall planes, in accordance with various aspects of the present disclosure.
Figure 2G:
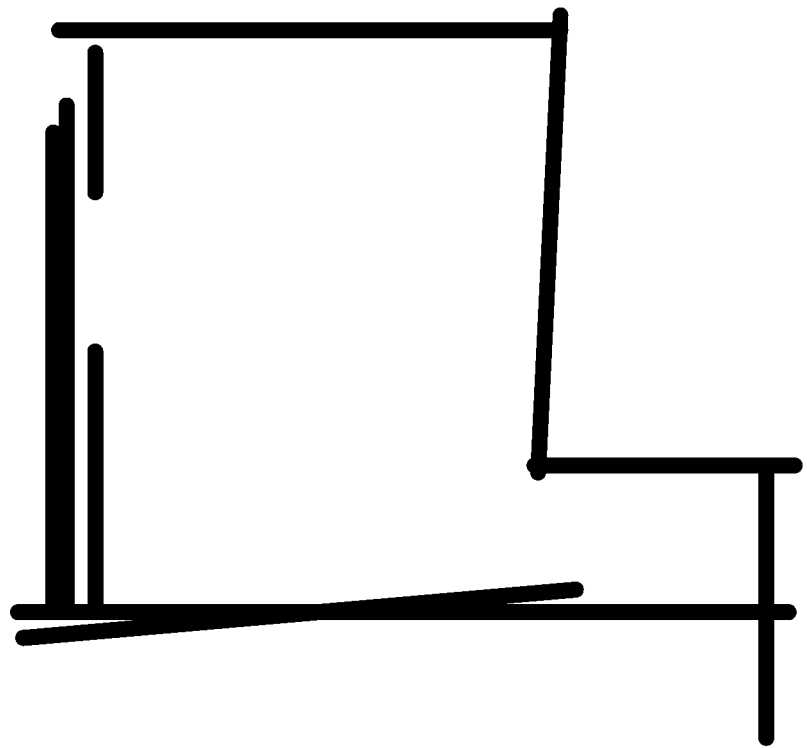
FIG. 2G represents extended candidate wall planes, in accordance with various aspects of the present disclosure.

FIG. 2G shows an example top down view of extended candidate wall planes prior to the first stage deduplication operation. FIG. 2H illustrates the same top-down view of plane data following first stage deduplication. As can be seen, various candidate wall planes from FIG. 2G have been deleted in FIG. 2H (e.g., those that were within a threshold distance and threshold angle from a different plane). The remaining wall candidate planes in FIG. 2H have been numbered for reference. In an example, wall candidate plane 5 and wall candidate plane 7 may have been too far apart to be subject to deduplication (e.g., the distance between wall candidate plane 5 and wall candidate plane 7 may be greater than the distance threshold used for first stage deduplication).

Figure 2I:
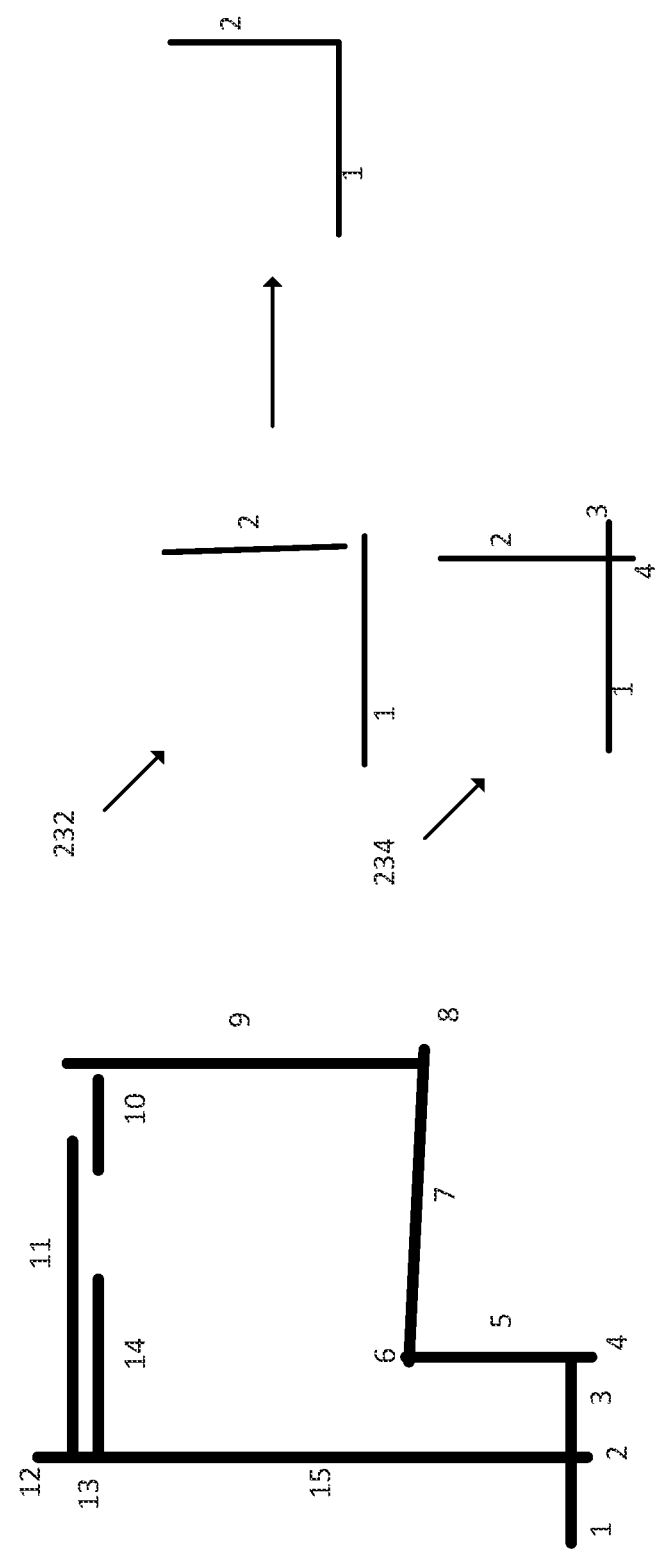
FIG. 2I represents splitting of extended candidate wall planes into wall fragments and fragment removal, in accordance with various aspects of the present disclosure.

In FIG. 2I, following first stage deduplication, the remaining candidate wall planes may be further modified. For example, candidate wall planes that are within a threshold distance of one another, but which do not meet, and which are sufficiently perpendicular (e.g., 90°+/−10% or some other suitable tolerance) may be joined. In example 232, candidate wall plane 1 and candidate wall plane 2 may not meet, but may be sufficiently close to one another (within a threshold distance of one another). Additionally, candidate wall plane 1 and candidate wall plane 2 may have an angle of approximately 90° (to within a selected tolerance) between orientations of the candidate wall planes. Accordingly, one or more of candidate wall plane 1 and candidate wall plane 2 may be extended so that candidate wall plane 1 and candidate wall plane 2 meet one another. Optionally, the angle of intersection may be modified to be 90°. However, in some other examples, the angle of intersection may be left as is.

In another example, one candidate wall plane may bisect another candidate wall plane. The different portions of such intersecting candidate wall planes may be labeled as different fragments. For example, a plane may intersect with and extend beyond another plane. For example, a candidate wall plane may cross another candidate wall plane. In FIG. 2I, a candidate wall plane that intersects another in example 234 may be labeled as wall fragment 1, wall fragment 3, wall fragment 2, and wall fragment 4, as shown.

Figure 2K:
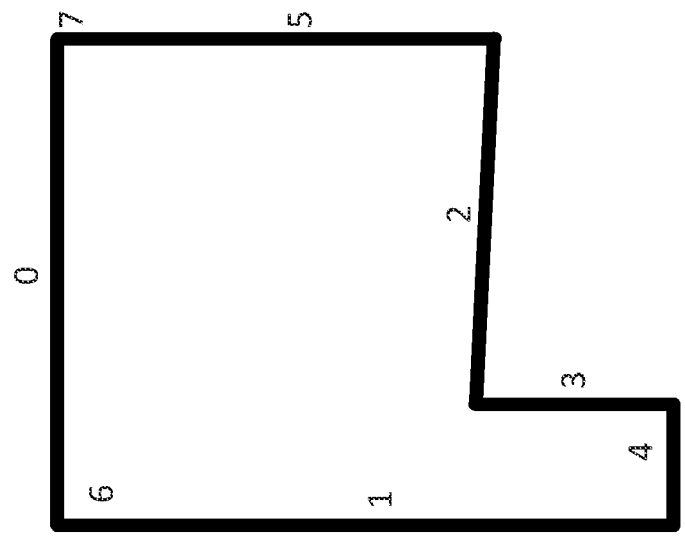
FIG. 2K represents a second deduplication operation applied to the candidate wall planes of FIG. 2J, in accordance with various aspects of the present disclosure.
Figure 2J:
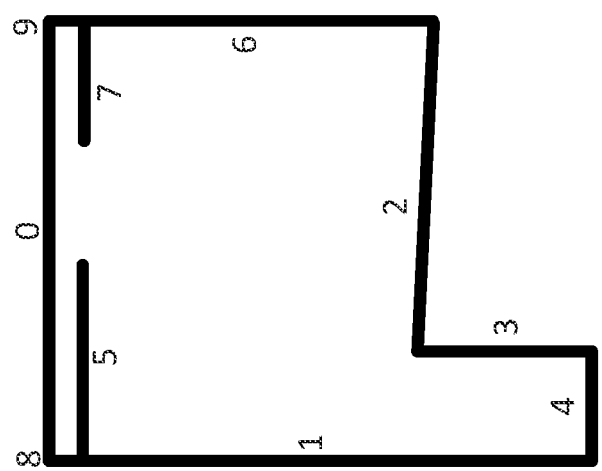
FIG. 2J represents a top-down image of candidate wall planes following fragment removal, in accordance with various aspects of the present disclosure.

FIG. 2J represents a top-down image of candidate wall planes following the modifications of FIG. 2I. The candidate wall planes in FIG. 2J have been renumbered relative to the wall fragments of FIG. 2I. In some examples, a second stage deduplication operation may optionally be performed by 3D room model generator 124. The second stage deduplication may have larger distance, overlap, and/or angle thresholds relative to the first stage deduplication. Accordingly, the second stage deduplication may be more aggressive in removing duplicate candidate wall planes relative to the first stage deduplication. In the example of FIG. 2K, the candidate wall planes 5 and 7 have been removed after the second stage deduplication. In the example, candidate wall planes 5 and 7 may have been within a threshold angle and threshold distance of candidate wall plane 0. However, candidate wall plane 0 may be associated with a larger (as determined using the occupancy grid 226 of FIG. 2E).

Figure 2M:
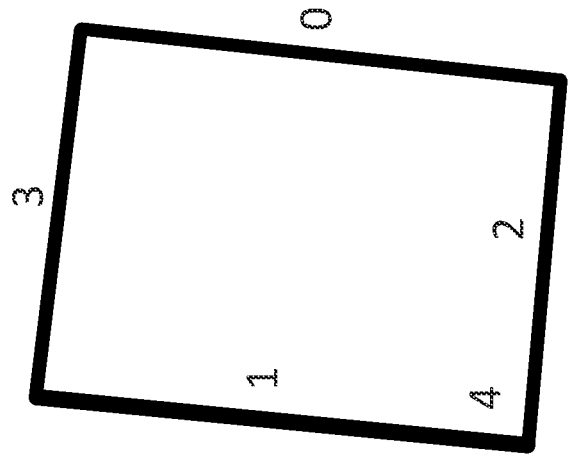
FIGS. 2L and 2M represent a trimming operation that may be used to refine candidate wall planes in accordance with various aspects of the present disclosure.
Figure 2L:
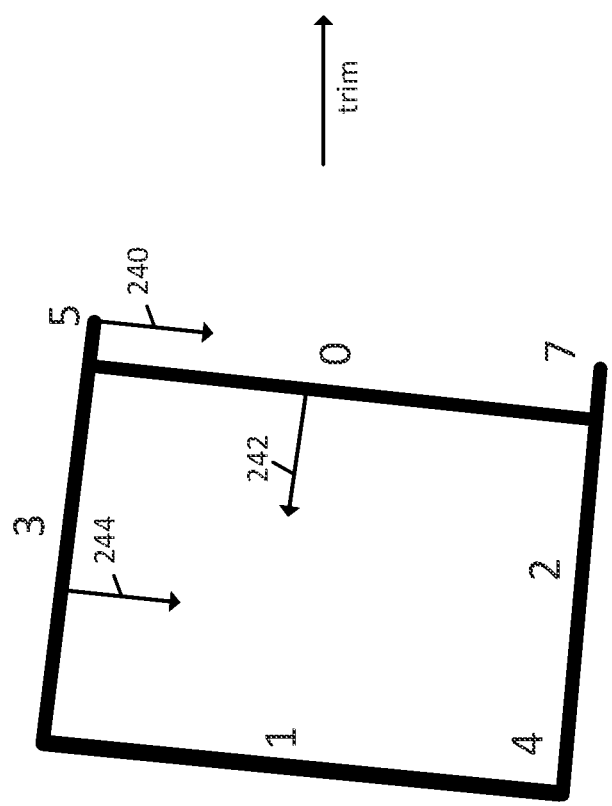

FIGS. 2L and 2M represent a trimming operation that may be used to refine candidate wall planes in accordance with various aspects of the present disclosure. In the trimming operation, a starting candidate wall plane may be selected. Any plane may be selected as a starting plane according to the desired implementation. For example, candidate wall plane 3 may be selected as the starting plane. After selecting the starting candidate wall plane, the current room model may be traversed (e.g., clockwise or counterclockwise, depending on the desired implementation) and determine candidate wall planes that intersect with the current candidate wall plane being evaluated. An assumption for the trimming operation may be that any intersection of candidate wall planes may only have two candidate wall planes connected to it. In the example of FIG. 2L the intersection of candidate wall planes 3, 5, and 0 has three candidate wall planes connected to it. Accordingly, this is an invalid chain of candidate wall planes.

Instead, valid chains of candidate wall planes at this intersection could be candidate wall planes 3 and 5, candidate wall planes 3 and 0, or candidate wall planes 5 and 0. A list of candidate wall plane chains may be generated. For example, one candidate wall plane chain may be 3, 0, 2, 4, 1. This candidate wall plane chain includes all valid candidate wall planes as no intersection includes more than two candidate wall plane chains. Another candidate wall plane chain may be 3, 5, 0, 2, 4, 1. This candidate wall plane chain includes an invalid combination (namely 3, 5, 0, as all of these candidate wall planes intersect at a single intersection, violating the intersection rule—no more than two candidate wall planes at a single intersection).

Using a brute force computational approach, all valid candidate wall plane chains may be evaluated and the candidate wall plane chain having the highest score (as determined using occupancy grid 226) may be selected (resulting in the candidate room shown in FIG. 2M). Invalid candidate wall plane chains may be removed upon determining that a chain violates the intersection rule (no more than two candidate wall planes at a single intersection) or that a particular candidate wall plane is not valid in a certain combination (as described below).

However, in some other approaches, invalid candidate wall plane chains may be pruned prior to computing the score for each valid chain. In some examples, a "normal rule" may be used to prune invalid candidate wall plane chains. The normal rule assumes each wall plane has a normal vector that points toward an enclosed space formed by the room. See, for example, normal vectors 240, 242 in FIG. 2L (normal vector 240 being normal to candidate wall plane 5 and pointing toward the interior of an enclosed space (the space enclosed by candidate wall planes 5, 0, and 7) and normal vector 242 being normal to candidate wall plane 0 and pointing toward the interior of an enclosed space). If a candidate wall plane is rotated to align with another candidate wall plane, the normal vectors should point in opposite directions if the rotated candidate wall plane is valid for combination with the non-rotated candidate wall plane. If, after rotation, the normal vectors point in the same direction, the rotated candidate wall plane is invalid in that combination.

For example, if candidate wall plane 5 is rotated clockwise (along an axis defined by the intersection 3, 5, 0) until candidate wall plane 5 aligns with candidate wall plane 0, the normal vectors 240 and 242 will point in the same direction. Accordingly, candidate wall plane 5 is not a valid combination with candidate wall plane 0. Conversely, if candidate wall plane 5 is rotated around the same axis such that candidate wall plane 5 aligns with candidate wall plane 3, normal vectors 240 and 244 will point in opposite directions, indicating that candidate wall plane 3 and candidate wall plane 5 form a valid chain. Similarly, if candidate wall plane 3 is rotated around the 3, 5, 0 intersection until candidate wall plane 3 aligns with candidate wall plane 0, normal vectors 242 and 244 point in opposite directions, indicating that candidate wall plane 3 and candidate wall plane 0 form a valid combination. Since the combination of 5 and 0 are invalid, any chains including this combination may be pruned and no score need be calculated for such combinations. As can be seen in FIG. 2M, after trimming, candidate wall planes 5 and 7 are removed from the room model. Accordingly, the room model 2M may be a top-down example of the walls of 3D room model that accurately represents the scanned room (as determined using the input 3D mesh data 150 and plane data 152. In various examples, the phantom walls generated as described in FIG. 2N below may be added during the trimming optimization procedure described above in FIGS. 2L, 2M. Accordingly, phantom walls may be used in determination of valid chains. However, such phantom walls do not have any contribution to the chain scores.

Figure 2N:
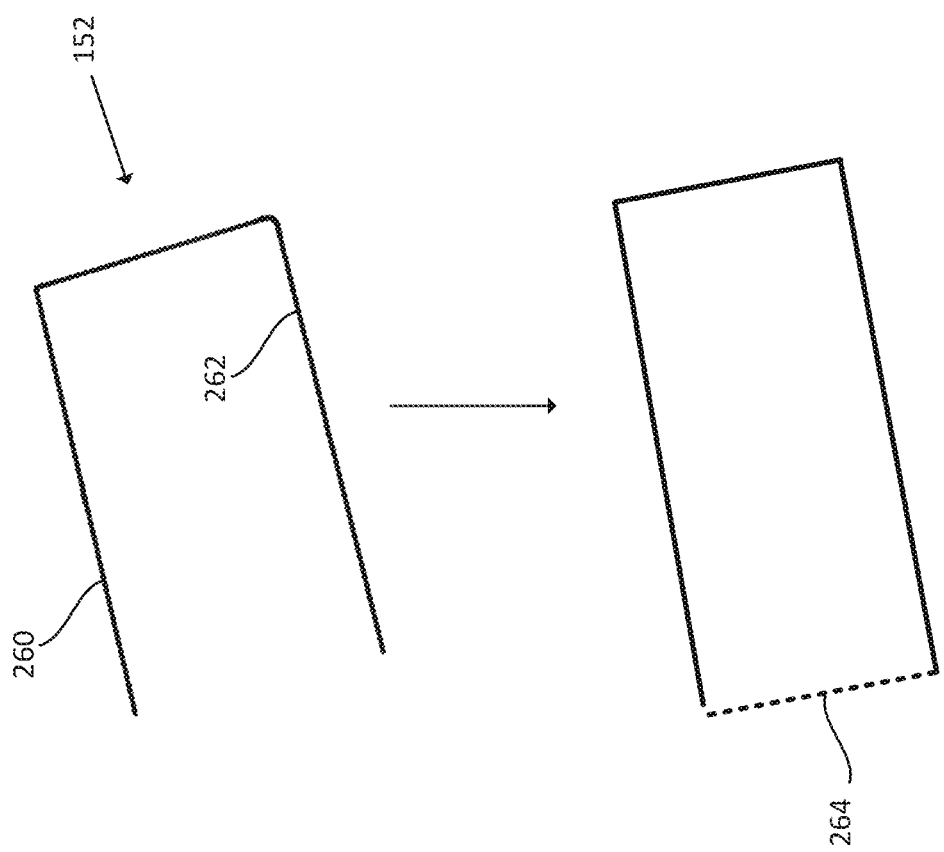
FIG. 2N represents a phantom wall generation operation that may be used in 3D room modeling, in accordance with various aspects of the present disclosure.

FIG. 2N represents a phantom wall generation operation that may be used in 3D room modeling, in accordance with various aspects of the present disclosure. In various examples, wall candidates in the plane data 152 may be unconnected to one another for a given room. For example, in the plane data 152 shown in FIG. 2N has an opening between candidate wall planes 260 and 262. In various examples, if there is a missing candidate wall following the second stage deduplication (e.g., the deduplication stage between FIGS. 2J and 2K), a phantom candidate wall may be inserted. In the example of FIG. 2N, phantom wall 264 has been inserted to connect candidate wall planes 260 and 262. Phantom walls may be considered when building chains during trimming (as described above). Accordingly, chains may include phantom wall planes. However, phantom walls may not have any score when computing the combined score of a candidate chain of wall candidates. After completion of the trimming (potentially using phantom walls if all candidate wall planes are not connected), the 3D room model 140 may be complete. The 3D room model 140 may include a full shell 3D model of the room (accurately representing the ceiling, walls, and floors and their respective proportions).

Figure 3:
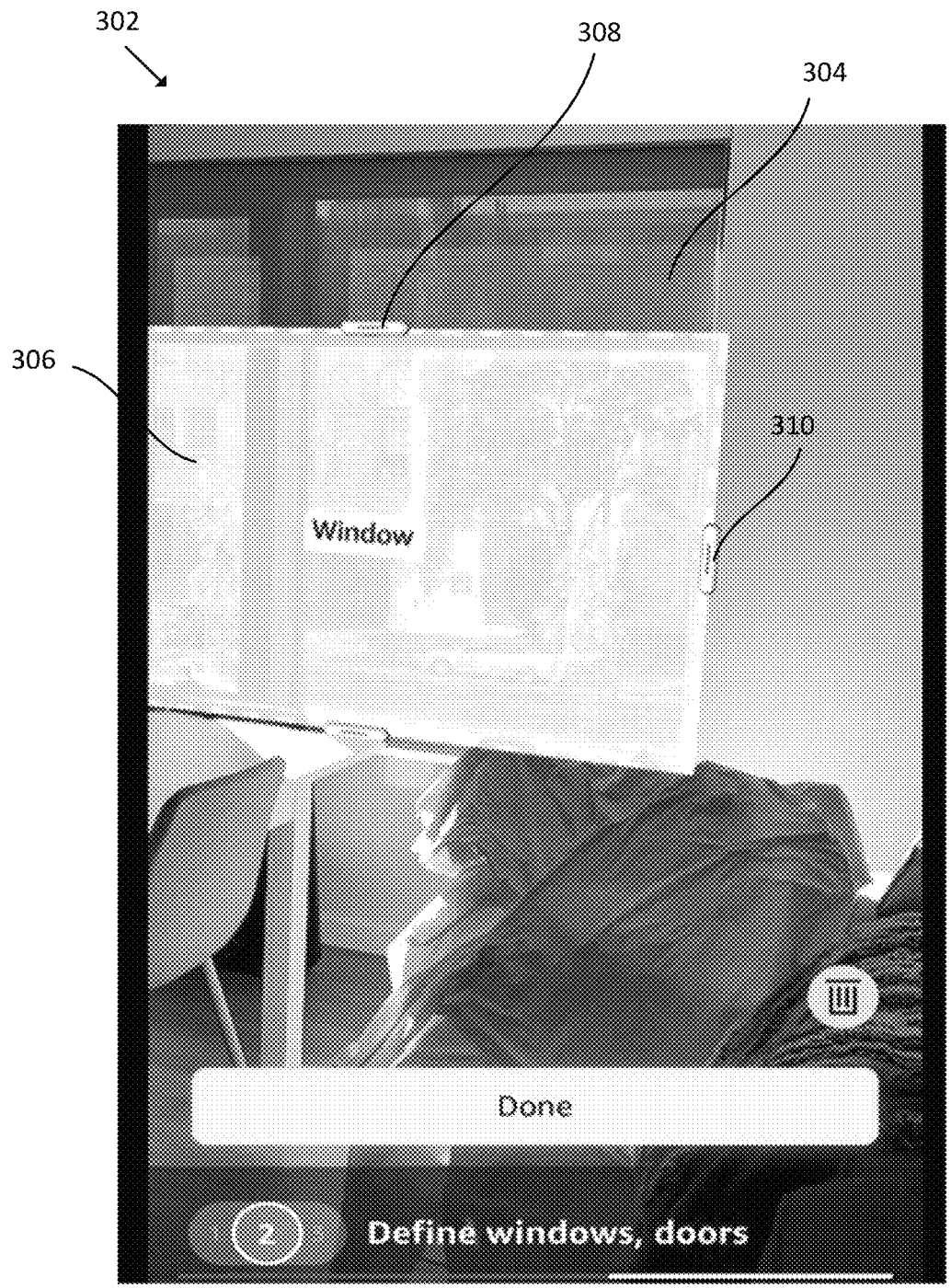
FIG. 3 displays an example of feature detection within a frame of image data, in accordance with various aspects of the present disclosure.

After completion of the 3D room model 140, various wall features may be added to the walls of the 3D room model 140. During scanning of the room 118, each frame of RGB image data may be input into a classifier model (e.g., a convolutional neural network based classifier) that may generate a feature representation of the frame of image data and may classify whether one or more features are present in the image. FIG. 3 displays an example of feature detection within a frame 302 of image data. For example, during scanning of a user's room the user may point the camera of the user's mobile device 106 at a window of the room 118. A classifier model may receive the frame 302 as an input and may generate one or more feature representations of the frame 302 (e.g., using various convolutional layers, pooling layers, and/or activation layers). The encoded representation (e.g., the feature representation) may be input into a classifier model that may be trained to detect various features such as doors, windows, fireplaces, wall openings, etc. The classifier model may be trained using training data that comprises annotated images (e.g., an image depicting at least a portion of a door where the portion of the door is identified (e.g., using a bounding box and/or a pixel-wise segmentation mask) using label data.

In the example of FIG. 3, the frame 302 includes a window 304 which is a part of the physical room 118. The classifier model has predicted a window 306 within the frame. As seen, the overlay window 306 may label the detected feature (e.g., as "window"). Additionally, the predicted feature (e.g., the overlay window 306) may not, in some cases, be of accurate dimensions. As can be seen in the example of FIG. 3, the overlay window 306 is not as tall as the actual window 304. Accordingly, sliders and/or other graphical control elements 308, 310 may allow the user to resize the detected feature to be commensurate with the feature in the frame of image data. The user may be prevented from resizing the feature such that the feature extends beyond the boundaries of the candidate wall plane on which the feature is located and/or such that the feature overlaps with another wall feature (e.g., another door, window, etc.). For example, a door may not extend above the ceiling and not below the floor. The door may only be applied on the candidate wall plane associated with the door. In some examples, the wall feature may have minimum dimensions (e.g., minimum height and minimum width). However, options may be provided to allow the user to override these minimum dimensions so that the boundaries of the room feature may correspond to the dimensions of the actual room feature (e.g., the actual window dimensions).

In some examples, the classifier may be unable to predict the boundary of a particular wall feature (e.g., a door, window, etc.) during scanning even though the feature is detected and/or classified (e.g., classified as a door). In such examples, a standard-size door (or other standard-size wall feature, depending on the detected feature) may be placed on the wall that is centered on a cross-hair or other visual indicator that is shown on the user display superimposed over the wall. If the standard-size wall feature centered at the cross-hair is unable to fit on the wall (e.g., due to the wall ending and/or intersecting with another wall, the floor, and/or the ceiling, due to the standard-size wall feature intersecting with another wall feature (e.g., another window, door, etc.)) the standard-size wall feature may be moved away from the obstructing boundary until the wall feature fits on the wall without intersecting a boundary.

The overlay of the feature may be superimposed on top of the actual image data on a frame-by-frame basis while the user is scanning so that the user is able to apply features to candidate wall planes during the scanning operation. In some examples, the user may be able to modify a type of the feature. This may be useful in cases of misclassification (e.g., where the 3D room model generator 124 classifies a door as a window, etc.) and/or so that the user can modify the 3D room model 140 to their liking.

In various examples, after the user has scanned the room and the 3D room model 140 is generated, the room model generator 124 may have an optional feature detection mode. The feature detection mode may access the camera of the mobile device 106. In some examples, there may be a cross-hair or other visual indicator displayed on the display of the mobile device. The cross-hair or other visual indicator may be the center point of a live field-of-view of the mobile device 106 camera (displaying a live camera view). The position of the cross-hair or other visual indicator may be used as an input signal for feature detection (e.g., to the classifier model). If the user is facing a wall with the camera of the mobile device 106, the wall will correspond to a wall within the 3D room model 140. Accordingly, the classifier model may determine a wall of 3D room model 140 to which any detected feature may pertain. Additionally, the classifier model may predict a placement of the feature on the wall of the 3D room model 140. In some examples, the classifier model may predict a particular feature when the cross-hair or other visual indicator is over a portion of the real-world room feature. For example, if there are two windows on a particular wall, but the user cross-hair is over the leftmost window, the classifier model may detect a window corresponding to the leftmost window (in terms of window size, frame type, frame color, etc.) and may place the virtual feature (e.g., the virtual window) in the 3D room model 140 at a corresponding positon within the 3D room model 140.

In addition to the classifier model for wall features (such as windows, doors, fireplaces, mantles, wall openings, built-in shelves, trim, crown molding, etc.) room model generator 124 may include other classifier models that may be used to detect different room features. For example, a wall color classifier may use RGB frames of image data of the walls of the room 118 to predict a wall color for the 3D room model 140. In one example implementation, a CNN and/or vision transformer may generate a feature representation of the color(s) detected on various walls from the frames of RGB image data. The feature representation may be used to predict a color (e.g., from a predefined color palette) that is closest to the feature representation of the color. In another example, a floor type classifier model may predict the type of floor (e.g., hardwood floorboards, tile, carpet, etc.) along with a texture of the floor (e.g., shag carpet, floorboard width, etc.). A floor color classifier model may predict a color of the floor to be used in the 3D room model 140. The floor color classifier may function similar to the wall color classifier model described above. Additionally, the classifier model (or models) for wall features may be trained to detect various sub-classes of wall features. For example, instead of merely predicting that a particular wall feature is a "door," the classifier model may be trained to predict a particular type of door (e.g., French door, sliding glass door, wooden door, etc.) and/or properties of the door (e.g., texture, color, shape, features (e.g., glass panels, stained glass, transom windows, etc.).

Once all colors, textures, and room features are determined for the 3D room model 140, the data (e.g., the 3D room model 140 defining the various walls and other surfaces, the colors of the surfaces, the textures, the room features, etc.) may be sent to a rendering device and/or system that may render a 3D version of the 3D room model 140 having all of the colors, textures, features, and relative dimensions. The renderer may simulate light from the windows and shadows and may create a photorealistic 3D room model 140 that resembles an empty version of the physical room 118 (empty apart from the detected features). The user may then try out various interior designs and/or furniture models within the room for interior design purposes and/or to determine what types of furniture fit within and/or complement various spaces in the room. Mapping a two-dimensional wall feature (and/or other room feature) onto a 3D room model may sometimes result in pose issues. In some examples, an iterative closest point (ICP) pose correction algorithm may be used. The depth frame and a current reconstructed mesh of the 3D room model may be used as an input to the ICP pose correction algorithm. The ICP pose correction algorithm may convert the depth point into a set of 3D points and may map the two-dimensional detected room feature to the set of 3D points (e.g., as frame level registration of detected features).

Figure 4:
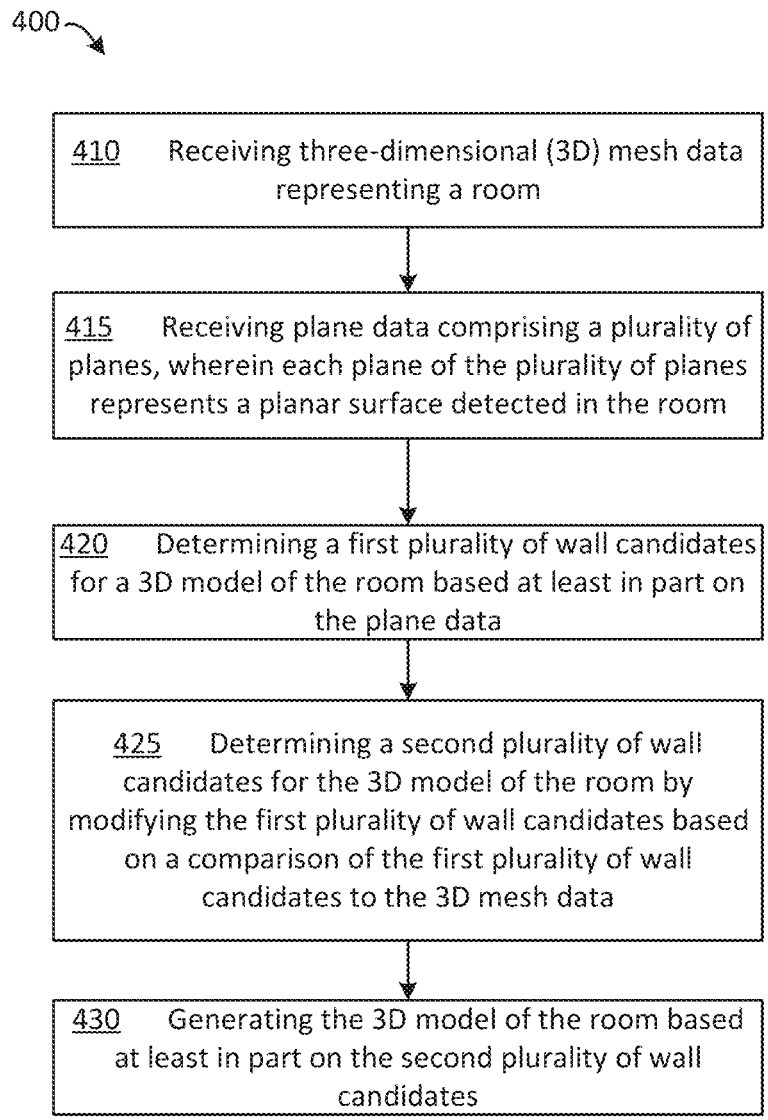
FIG. 4 is a flow chart depicting an example process for 3D room modeling, in accordance with various aspects of the present disclosure.

FIG. 4 is a flow chart depicting an example process 400 for 3D room modeling, in accordance with various aspects of the present disclosure. Those portions of FIG. 4 that have been previously discussed in reference to FIGS. 1-3 may not be described again for purposes of clarity and brevity. The actions of the process 400 may represent a series of instructions comprising computer-readable machine code executable by one or more processing units of one or more computing devices. In various examples, the computer-readable machine codes may be comprised of instructions selected from a native instruction set of and/or an operating system (or systems) of the one or more computing devices. Although the figures and discussion illustrate certain operational steps of the system in a particular order, the steps described may be performed in a different order (as well as certain steps removed or added) without departing from the intent of the disclosure.

Process 400 of FIG. 4 may begin at action 410, at which 3D mesh data representing a room may be received. The 3D mesh data may be received from 3D modeling software library included in a mobile application of a mobile device including a camera and/or a Lidar sensor. For example, ARKit may be used to generate the 3D mesh data. The 3D mesh data may classify various surfaces detected within the room (although the classifications and/or the boundaries between surfaces often include errors and inaccuracies). The 3D mesh data may include a depth map and thus the 3D mesh data may be proportional to the actual room as the Lidar sensor may determine various distances between the camera and various surfaces in the room and various distances between different surfaces detected in the room.

Processing may continue at action 415, at which plane data comprising a plurality of planes may be received. Each plane of the plurality of planes may represent a planar surface detected in the room. For example, plane data 152 may include planes representing surfaces detected in the physical environment (e.g., room 118). For example, the plane data 152 represents polygons representing detected surfaces that may be used as an input to the 3D room model generator 124, in various examples. Similarly, in various examples, the plane data 152 may be determined using the RGB image data output by a camera of mobile device 106. In other examples, the plane data 152 may be generated using RGB image frames and depth data received from a Lidar sensor, stereoscopic camera, time-of-flight sensor, etc. Plane data 152 and 3D mesh data 150 may be output by one or more software libraries associated with (e.g., configured to process data output by) the Lidar sensor and/or the camera.

Processing may continue at action 420, at which a first plurality of wall candidates for a 3D model of the room may be determined based at least in part on the plane data. For example, a top down view of the plane data (e.g., an evaluation of all the vertical and/or nearly vertical (within a tolerance) planes) may be used to determine an initial set of wall candidates for the 3D model of the room. The first plurality of wall candidates may be corrected using various preprocessing operations as described above in reference to FIGS. 2C, 2D.

Processing may continue at action 425, at which a second plurality of wall candidates may be determined for the 3D model of the room by modifying the first plurality of wall candidates based on a comparison of the first plurality of wall candidates to the 3D mesh data. For example, occupancy grid 226 may be determined using a top-down view of the 3D mesh data. The first plurality of wall candidates may be refined using the occupancy grid 226 and various other logic, as described above in reference to FIGS. 2A-2N. For example, various wall candidate extension, deduplication, fragment removal, trimming, and other operations may be performed to determine an accurate set of wall candidates that reflect the true wall surfaces within the physical room, together with their specific and relative dimensions, angles, etc.

Processing may continue at action 430, at which the 3D model of the room may be generated based at least in part on the second plurality of wall candidates. For example, the 3D room model 140 may be generated using the second plurality of wall candidates by a 3D rendering device. In addition, various room features, colors, textures, etc., may be rendered so that the 3D room model resembles the actual physical room scanned by the user (but optionally without furniture and/or other objects present in the physical room).

Figure 5:
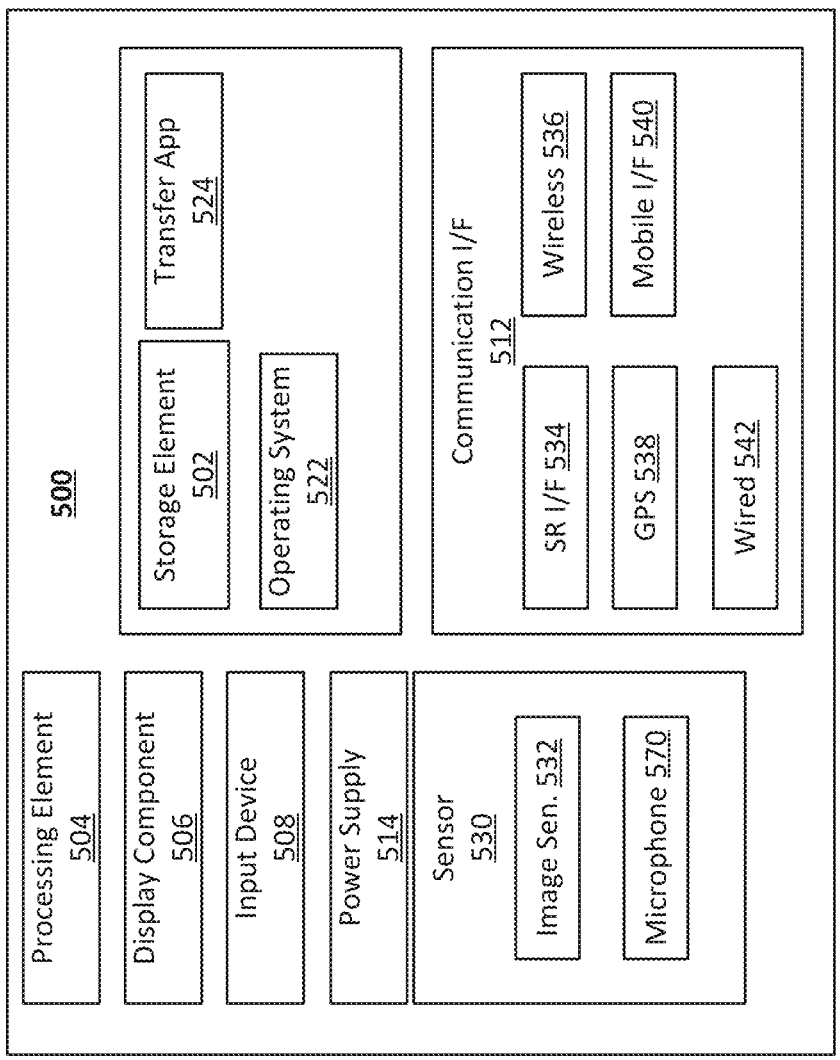
FIG. 5 is a block diagrams showing an example architecture of a computing device that may be used in accordance with various embodiments described herein.

FIG. 5 is a block diagram showing an example architecture 500 of a computing device that may be used for 3D room modeling, in accordance with various aspects of the present disclosure. It will be appreciated that not all devices will include all of the components of the architecture 500 and some user devices may include additional components not shown in the architecture 500. The architecture 500 may include one or more processing elements 504 for executing instructions and retrieving data stored in a storage element 502. The processing element 504 may comprise at least one processor. Any suitable processor or processors may be used. For example, the processing element 504 may comprise one or more digital signal processors (DSPs). The storage element 502 can include one or more different types of memory, data storage, or computer-readable storage media devoted to different purposes within the architecture 500. For example, the storage element 502 may comprise flash memory, random-access memory, disk-based storage, etc. Different portions of the storage element 502, for example, may be used for program instructions for execution by the processing element 504, storage of images or other digital works, and/or a removable storage for transferring data to other devices, etc. Additionally, storage element 502 may store parameters, and/or machine learning models generated using the various techniques described herein.

The storage element 502 may also store software for execution by the processing element 504. An operating system 522 may provide the user with an interface for operating the computing device and may facilitate communications and commands between applications executing on the architecture 500 and various hardware thereof. A transfer application 524 may be configured to receive images, audio, and/or video from another device (e.g., a mobile device, image capture device, and/or display device) or from an image sensor 532 and/or microphone 570 included in the architecture 500.

When implemented in some user devices, the architecture 500 may also comprise a display component 506. The display component 506 may comprise one or more light-emitting diodes (LEDs) or other suitable display lamps. Also, in some examples, the display component 506 may comprise, for example, one or more devices such as cathode ray tubes (CRTs), liquid-crystal display (LCD) screens, gas plasma-based flat panel displays, LCD projectors, raster projectors, infrared projectors or other types of display devices, etc. As described herein, display component 506 may be effective to display input images and/or 3D room models generated in accordance with the various techniques described herein.

The architecture 500 may also include one or more input devices 508 operable to receive inputs from a user. The input devices 508 can include, for example, a push button, touch pad, touch screen, wheel, joystick, keyboard, mouse, trackball, keypad, light gun, game controller, or any other such device or element whereby a user can provide inputs to the architecture 500. These input devices 508 may be incorporated into the architecture 500 or operably coupled to the architecture 500 via wired or wireless interface. In some examples, architecture 500 may include a microphone 570 or an array of microphones for capturing sounds, such as voice requests. In various examples, audio captured by microphone 570 may be streamed to external computing devices via communication interface 512.

When the display component 506 includes a touch-sensitive display, the input devices 508 can include a touch sensor that operates in conjunction with the display component 506 to permit users to interact with the image displayed by the display component 506 using touch inputs (e.g., with a finger or stylus). The architecture 500 may also include a power supply 514, such as a wired alternating current (AC) converter, a rechargeable battery operable to be recharged through conventional plug-in approaches, or through other approaches such as capacitive or inductive charging.

The communication interface 512 may comprise one or more wired or wireless components operable to communicate with one or more other computing devices. For example, the communication interface 512 may comprise a wireless communication module 536 configured to communicate on a network, such as the network 104, according to any suitable wireless protocol, such as IEEE 802.11 or another suitable wireless local area network (WLAN) protocol. A short range interface 534 may be configured to communicate using one or more short range wireless protocols such as, for example, near field communications (NFC), Bluetooth, Bluetooth LE, etc. A mobile interface 540 may be configured to communicate utilizing a cellular or other mobile protocol. A Global Positioning System (GPS) interface 538 may be in communication with one or more earth-orbiting satellites or other suitable position-determining systems to identify a position of the architecture 500. A wired communication module 542 may be configured to communicate according to the USB protocol or any other suitable protocol.

The architecture 500 may also include one or more sensors 530 such as, for example, one or more position sensors, image sensors, and/or motion sensors. An image sensor 532 is shown in FIG. 5. Some examples of the architecture 500 may include multiple image sensors 532. For example, a panoramic camera system may comprise multiple image sensors 532 resulting in multiple images and/or video frames that may be stitched and may be blended to form a seamless panoramic output. An example of an image sensor 532 may be a camera configured to capture color information, image geometry information, and/or ambient light information.

As noted above, multiple devices may be employed in a single system. In such a multi-device system, each of the devices may include different components for performing different aspects of the system's processing. The multiple devices may include overlapping components. The components of the computing device(s) 120, as described herein, are exemplary, and may be located as a stand-alone device or may be included, in whole or in part, as a component of a larger device or system.

Figure 6:
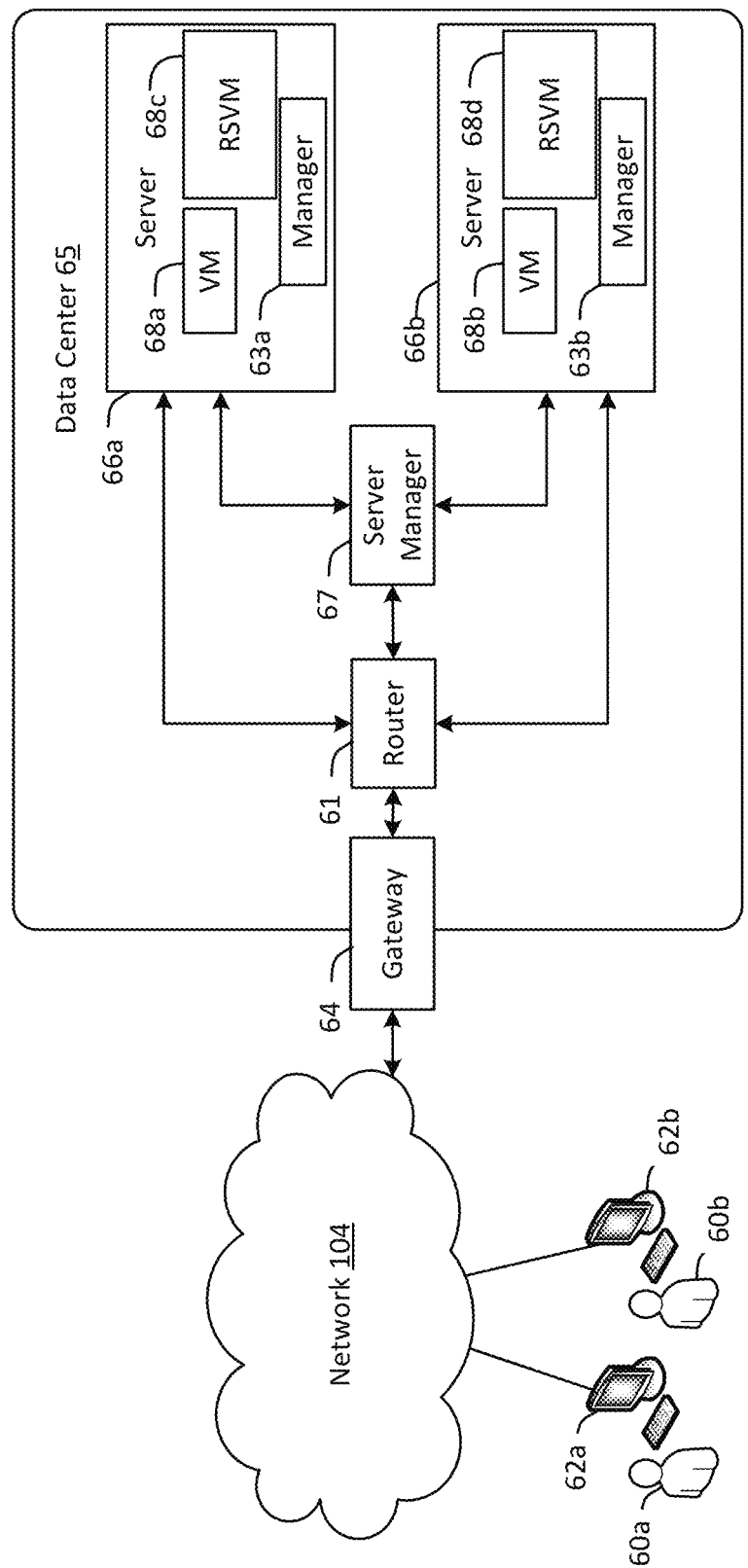
FIG. 6 is a diagram illustrating an example system for sending and providing data that may be used in accordance with the present disclosure.

An example system for sending and providing data will now be described in detail. In particular, FIG. 6 illustrates an example computing environment in which the embodiments described herein may be implemented. For example, the computing environment of FIG. 6 may be used to provide 3D room model generation as a service over a network wherein one or more of the techniques described herein may be requested by a first computing device and may be performed by a different computing device configured in communication with the first computing device over a network. FIG. 6 is a diagram schematically illustrating an example of a data center 65 that can provide computing resources to users 60a and 60b (which may be referred herein singularly as user 60 or in the plural as users 60) via user computers 62a and 62b (which may be referred herein singularly as user computer 62 or in the plural as user computers 62) via network 104. Data center 65 may be configured to provide computing resources for executing applications on a permanent or an as-needed basis. The computing resources provided by data center 65 may include various types of resources, such as gateway resources, load balancing resources, routing resources, networking resources, computing resources, volatile and non-volatile memory resources, content delivery resources, data processing resources, data storage resources, data communication resources and the like. Each type of computing resource may be available in a number of specific configurations. For example, data processing resources may be available as virtual machine instances that may be configured to provide various web services. In addition, combinations of resources may be made available via a network and may be configured as one or more web services. The instances may be configured to execute applications, including web services, such as application services, media services, database services, processing services, gateway services, storage services, routing services, security services, encryption services, load balancing services, application services and the like. In various examples, the instances may be configured to execute one or more of the various 3D room modeling techniques described herein.

These services may be configurable with set or custom applications and may be configurable in size, execution, cost, latency, type, duration, accessibility and in any other dimension. These web services may be configured as available infrastructure for one or more clients and can include one or more applications configured as a system or as software for one or more clients. These web services may be made available via one or more communications protocols. These communications protocols may include, for example, hypertext transfer protocol (HTTP) or non-HTTP protocols. These communications protocols may also include, for example, more reliable transport layer protocols, such as transmission control protocol (TCP), and less reliable transport layer protocols, such as user datagram protocol (UDP). Data storage resources may include file storage devices, block storage devices and the like.

Each type or configuration of computing resource may be available in different sizes, such as large resources—consisting of many processors, large amounts of memory and/or large storage capacity—and small resources—consisting of fewer processors, smaller amounts of memory and/or smaller storage capacity. Customers may choose to allocate a number of small processing resources as web servers and/or one large processing resource as a database server, for example.

Data center 65 may include servers 66a and 66b (which may be referred herein singularly as server 66 or in the plural as servers 66) that provide computing resources. These resources may be available as bare metal resources or as virtual machine instances 68a-d (which may be referred herein singularly as virtual machine instance 68 or in the plural as virtual machine instances 68). In at least some examples, server manager 67 may control operation of and/or maintain servers 66. Virtual machine instances 68c and 68d are rendition switching virtual machine ("RSVM") instances. The RSVM virtual machine instances 68c and 68d may be configured to perform all, or any portion, of the techniques for improved rendition switching and/or any other of the disclosed techniques in accordance with the present disclosure and described in detail above. As should be appreciated, while the particular example illustrated in FIG. 6 includes one RSVM virtual machine in each server, this is merely an example. A server may include more than one RSVM virtual machine or may not include any RSVM virtual machines.

The availability of virtualization technologies for computing hardware has afforded benefits for providing large scale computing resources for customers and allowing computing resources to be efficiently and securely shared between multiple customers. For example, virtualization technologies may allow a physical computing device to be shared among multiple users by providing each user with one or more virtual machine instances hosted by the physical computing device. A virtual machine instance may be a software emulation of a particular physical computing system that acts as a distinct logical computing system. Such a virtual machine instance provides isolation among multiple operating systems sharing a given physical computing resource. Furthermore, some virtualization technologies may provide virtual resources that span one or more physical resources, such as a single virtual machine instance with multiple virtual processors that span multiple distinct physical computing systems.

Referring to FIG. 6, network 104 may, for example, be a publicly accessible network of linked networks and possibly operated by various distinct parties, such as the Internet. In other embodiments, network 104 may be a private network, such as a corporate or university network that is wholly or partially inaccessible to non-privileged users. In still other embodiments, network 104 may include one or more private networks with access to and/or from the Internet.

Network 104 may provide access to user computers 62. User computers 62 may be computers utilized by users 60 or other customers of data center 65. For instance, user computer 62a or 62b may be a server, a desktop or laptop personal computer, a tablet computer, a wireless telephone, a personal digital assistant (PDA), an e-book reader, a game console, a set-top box or any other computing device capable of accessing data center 65. User computer 62a or 62b may connect directly to the Internet (e.g., via a cable modem or a Digital Subscriber Line (DSL)). Although only two user computers 62a and 62b are depicted, it should be appreciated that there may be multiple user computers.

User computers 62 may also be utilized to configure aspects of the computing resources provided by data center 65. In this regard, data center 65 might provide a gateway or web interface through which aspects of its operation may be configured through the use of a web browser application program executing on user computer 62. Alternately, a stand-alone application program executing on user computer 62 might access an application programming interface (API) exposed by data center 65 for performing the configuration operations. Other mechanisms for configuring the operation of various web services available at data center 65 might also be utilized.

Servers 66 shown in FIG. 6 may be servers configured appropriately for providing the computing resources described above and may provide computing resources for executing one or more web services and/or applications. In one embodiment, the computing resources may be virtual machine instances 68. In the example of virtual machine instances, each of the servers 66 may be configured to execute an instance manager 63a or 63b (which may be referred herein singularly as instance manager 63 or in the plural as instance managers 63) capable of executing the virtual machine instances 68. The instance managers 63 may be a virtual machine monitor (VMM) or another type of program configured to enable the execution of virtual machine instances 68 on server 66, for example. As discussed above, each of the virtual machine instances 68 may be configured to execute all or a portion of an application.

It should be appreciated that although the embodiments disclosed above discuss the context of virtual machine instances, other types of implementations can be utilized with the concepts and technologies disclosed herein. For example, the embodiments disclosed herein might also be utilized with computing systems that do not utilize virtual machine instances.

In the example data center 65 shown in FIG. 6, a router 61 may be utilized to interconnect the servers 66a and 66b. Router 61 may also be connected to gateway 64, which is connected to network 104. Router 61 may be connected to one or more load balancers, and alone or in combination may manage communications within networks in data center 65, for example, by forwarding packets or other data communications as appropriate based on characteristics of such communications (e.g., header information including source and/or destination addresses, protocol identifiers, size, processing requirements, etc.) and/or the characteristics of the private network (e.g., routes based on network topology, etc.). It will be appreciated that, for the sake of simplicity, various aspects of the computing systems and other devices of this example are illustrated without showing certain conventional details. Additional computing systems and other devices may be interconnected in other embodiments and may be interconnected in different ways.

In the example data center 65 shown in FIG. 6, a data center 65 is also employed to at least in part direct various communications to, from and/or between servers 66a and 66b. While FIG. 6 depicts router 61 positioned between gateway 64 and data center 65, this is merely an exemplary configuration. In some cases, for example, data center 65 may be positioned between gateway 64 and router 61. Data center 65 may, in some cases, examine portions of incoming communications from user computers 62 to determine one or more appropriate servers 66 to receive and/or process the incoming communications. Data center 65 may determine appropriate servers to receive and/or process the incoming communications based on factors such as an identity, location or other attributes associated with user computers 62, a nature of a task with which the communications are associated, a priority of a task with which the communications are associated, a duration of a task with which the communications are associated, a size and/or estimated resource usage of a task with which the communications are associated and many other factors. Data center 65 may, for example, collect or otherwise have access to state information and other information associated with various tasks in order to, for example, assist in managing communications and other operations associated with such tasks.

It should be appreciated that the network topology illustrated in FIG. 6 has been greatly simplified and that many more networks and networking devices may be utilized to interconnect the various computing systems disclosed herein. These network topologies and devices should be apparent to those skilled in the art.

It should also be appreciated that data center 65 described in FIG. 6 is merely illustrative and that other implementations might be utilized. It should also be appreciated that a server, gateway or other computing device may comprise any combination of hardware or software that can interact and perform the described types of functionality, including without limitation: desktop or other computers, database servers, network storage devices and other network devices, PDAs, tablets, cellphones, wireless phones, pagers, electronic organizers, Internet appliances, television-based systems (e.g., using set top boxes and/or personal/digital video recorders) and various other consumer products that include appropriate communication capabilities.

A network set up by an entity, such as a company or a public sector organization, to provide one or more web services (such as various types of cloud-based computing or storage) accessible via the Internet and/or other networks to a distributed set of clients may be termed a provider network. Such a provider network may include numerous data centers hosting various resource pools, such as collections of physical and/or virtualized computer servers, storage devices, networking equipment and the like, used to implement and distribute the infrastructure and web services offered by the provider network. The resources may in some embodiments be offered to clients in various units related to the web service, such as an amount of storage capacity for storage, processing capability for processing, as instances, as sets of related services and the like. A virtual computing instance may, for example, comprise one or more servers with a specified computational capacity (which may be specified by indicating the type and number of CPUs, the main memory size and so on) and a specified software stack (e.g., a particular version of an operating system, which may in turn run on top of a hypervisor).

A number of different types of computing devices may be used singly or in combination to implement the resources of the provider network in different embodiments, for example computer servers, storage devices, network devices and the like. In some embodiments a client or user may be provided direct access to a resource instance, e.g., by giving a user an administrator login and password. In other embodiments the provider network operator may allow clients to specify execution requirements for specified client applications and schedule execution of the applications on behalf of the client on execution systems (such as application server instances, Java™ virtual machines (JVMs), general-purpose or special-purpose operating systems that support various interpreted or compiled programming languages such as Ruby, Perl, Python, C, C++ and the like or high-performance computing systems) suitable for the applications, without, for example, requiring the client to access an instance or an execution system directly. A given execution system may utilize one or more resource instances in some implementations; in other implementations, multiple execution systems may be mapped to a single resource instance.

In many environments, operators of provider networks that implement different types of virtualized computing, storage and/or other network-accessible functionality may allow customers to reserve or purchase access to resources in various resource acquisition modes. The computing resource provider may provide facilities for customers to select and launch the desired computing resources, deploy application components to the computing resources and maintain an application executing in the environment. In addition, the computing resource provider may provide further facilities for the customer to quickly and easily scale up or scale down the numbers and types of resources allocated to the application, either manually or through automatic scaling, as demand for or capacity requirements of the application change. The computing resources provided by the computing resource provider may be made available in discrete units, which may be referred to as instances. An instance may represent a physical server hardware system, a virtual machine instance executing on a server or some combination of the two. Various types and configurations of instances may be made available, including different sizes of resources executing different operating systems (OS) and/or hypervisors, and with various installed software applications, runtimes and the like. Instances may further be available in specific availability zones, representing a logical region, a fault tolerant region, a data center or other geographic location of the underlying computing hardware, for example. Instances may be copied within an availability zone or across availability zones to improve the redundancy of the instance, and instances may be migrated within a particular availability zone or across availability zones. As one example, the latency for client communications with a particular server in an availability zone may be less than the latency for client communications with a different server. As such, an instance may be migrated from the higher latency server to the lower latency server to improve the overall client experience.

In some embodiments the provider network may be organized into a plurality of geographical regions, and each region may include one or more availability zones. An availability zone (which may also be referred to as an availability container) in turn may comprise one or more distinct locations or data centers, configured in such a way that the resources in a given availability zone may be isolated or insulated from failures in other availability zones. That is, a failure in one availability zone may not be expected to result in a failure in any other availability zone. Thus, the availability profile of a resource instance is intended to be independent of the availability profile of a resource instance in a different availability zone. Clients may be able to protect their applications from failures at a single location by launching multiple application instances in respective availability zones. At the same time, in some implementations inexpensive and low latency network connectivity may be provided between resource instances that reside within the same geographical region (and network transmissions between resources of the same availability zone may be even faster).

Figure 7:
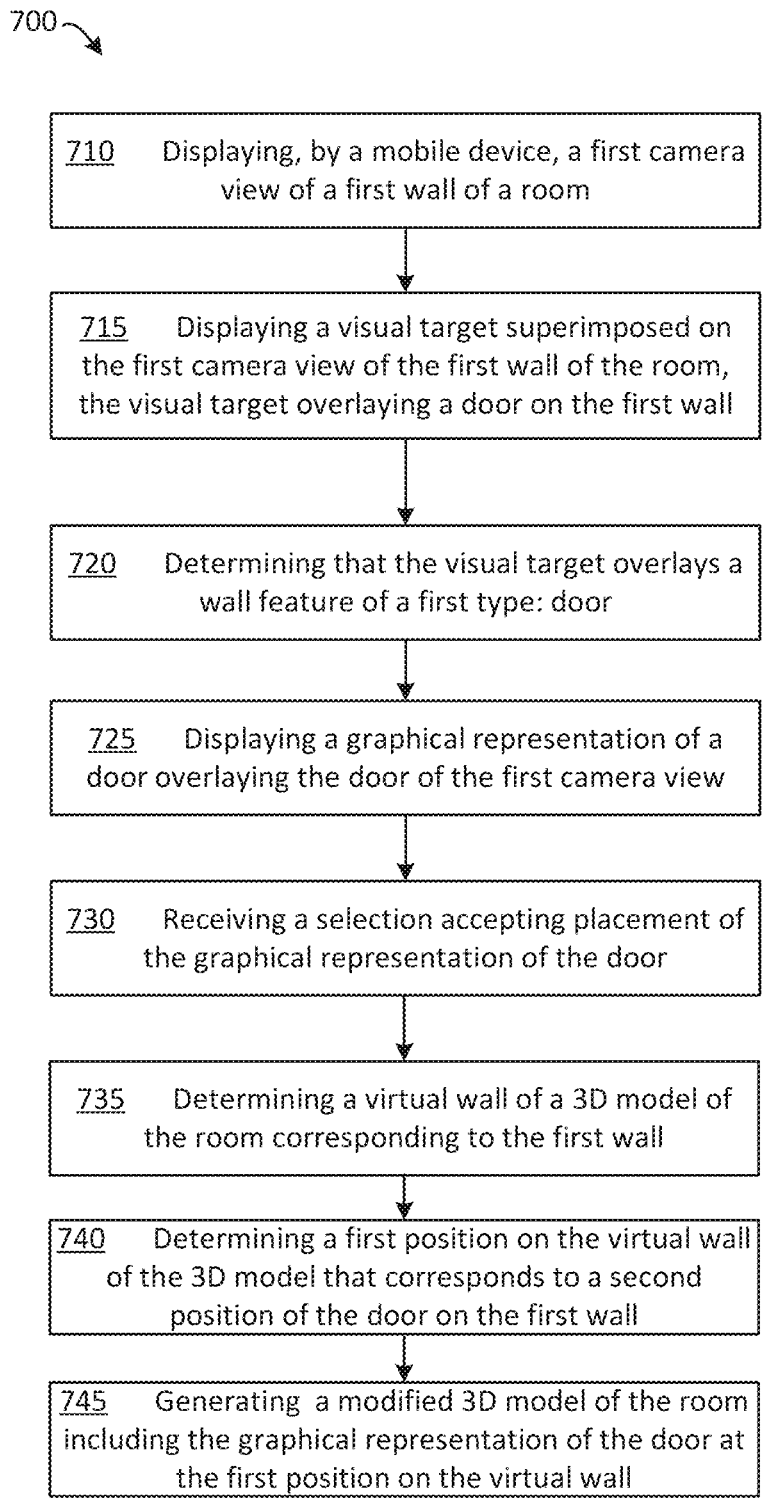
FIG. 7 is a diagram illustrating an example process for feature detection in 3D room modeling, in accordance with various aspects of the present disclosure.

FIG. 7 is a flow chart depicting an example process 700 for feature detection in 3D room modeling, in accordance with various aspects of the present disclosure. Those portions of FIG. 7 that have been previously discussed in reference to FIGS. 1-6 may not be described again for purposes of clarity and brevity. The actions of the process 700 may represent a series of instructions comprising computer-readable machine code executable by one or more processing units of one or more computing devices. In various examples, the computer-readable machine codes may be comprised of instructions selected from a native instruction set of and/or an operating system (or systems) of the one or more computing devices. Although the figures and discussion illustrate certain operational steps of the system in a particular order, the steps described may be performed in a different order (as well as certain steps removed or added) without departing from the intent of the disclosure.

Process 700 of FIG. 7 may begin at action 710, at which a mobile device may display a first camera view of a first wall of a room. For example, after generating a 3D room model and/or detecting the various wall planes of a 3D room model using the various techniques described herein, a user may use an application executing on a mobile device to detect wall features. The application may access the camera of the mobile device and may display the camera view to the user on a display.

Processing may continue at action 715, at which a visual target may be superimposed on the first camera view of the first wall of the room. The visual target may be cross-hair or other graphical indicator displayed on the display that overlays the camera view. In some instances, the visual target may be, but need not be, partially transparent. The visual target may overlay a wall feature of the room. In the example of FIG. 7, the visual target may overlay a door; although, in other examples, the pertinent wall feature may be a window, fireplace, wall opening, built-in bookshelf, etc.

Processing may continue at action 720, at which a determination may be made that the visual target overlays a wall feature of a first type: door. In various examples, the frames of image data being captured by the camera of the mobile device may be encoded using one or more convolutional layers (with each layer using one or more convolutional filters) of a convolutional neural network to generate feature representations of the frame. The feature representations may be input into a classifier model that may be trained using supervised learning techniques (e.g., a multilayer perceptron, neural network, etc.) to determine various wall features. In the current case, the classifier model may be trained to detect and classify various wall features such as doors, windows, wall openings, fireplaces, etc. Accordingly, the classifier model may determine that the visual target is overlaying a wall feature of the type: door since the x, y coordinate location of the visual target in the image frame corresponds to a bounding box and/or segmentation mask determined for the door and classified as the type: door.

Processing may continue at action 725, at which a graphical representation of a door overlaying the door of the first camera view may be displayed. For example, the application may generate a virtual door graphical overlay (which may or may not be partially transparent) in response to the detected wall feature being classified as being of the type: door. The application may position the graphical representation of the door within the image frame at the corresponding position of the door detected in the camera view (e.g., by positioning the virtual door within the bounding box/segmentation mask of the detected door). In various examples, there may be several classes of door that the classifier model has been trained to detect (e.g., Dutch door, French door, sliding glass door, solid interior door, exterior door with transom window, etc.). Accordingly, the virtual representation of the wall feature may correspond to the detected class. The various virtual wall features may be stored in memory and may be retrieved by the application for display.

Processing may continue at action 730, at which a selection may be received that accepts placement of the graphical representation of the door. For example, a user may modify and/or adjust the placement, size, and/or dimensions of the virtual door using various sliders and/or other graphical controls such that the virtual door (or other virtual wall feature) corresponds in size, shape, and/or position to the real-world door represented in the camera view. In addition, the user may be able to change the type and/or style of the wall feature (e.g., in case of misclassification and/or user preference). For example, the user may change a door to a window or may change a solid interior door to a glass paneled door. After the user is satisfied with the size, shape, type, and/or style of the virtual wall feature (e.g., the graphical representation of the door), the user may select a graphical control to accept the changes.

Processing may continue at action 735, at which a virtual wall of 3D model of the room may be determined that corresponds to the first wall. In various examples, a 3D shell model of the current room may have been generated using the various techniques described above with respect to FIGS. 1-2. The application may be used to detect a current view of the camera and may determine a wall in the 3D room model that corresponds to the wall being viewed by the camera. This may be determined using the orientation of the camera and the previously-generated 3D room model.

Processing may continue at action 740, at which a first position on the virtual wall of the 3D model may be determined that corresponds to a second position of the door on the first wall. For example, although the user has selected a position of the door on the real wall (as represented in the camera view), the application may determine a corresponding placement on the virtual wall of the 3D room model. Since the dimensions of the 3D room model correspond with the actual dimensions of the room, the application may determine the corresponding position on the virtual wall of the 3D room model.

Processing may continue at action 745, at which a modified 3D model of the room that includes the graphical representation of the door at the first position on the virtual wall may be generated. In various examples, a first two-dimensional view of the modified 3D model may be shown on a display of the mobile device. The user may manipulated the camera viewpoint of the 3D model to see the 3D model of the room from various angles.

Although various systems described herein may be embodied in software or code executed by general purpose hardware as discussed above, as an alternate the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those of ordinary skill in the art and consequently, are not described in detail herein.

The flowcharts and methods described herein show the functionality and operation of various implementations. If embodied in software, each block or step may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processing component in a computer system. If embodied in hardware, each block may represent a circuit or a number of interconnected circuits to implement the specified logical function(s).

Although the flowcharts and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

Also, any logic or application described herein that comprises software or code can be embodied in any non-transitory computer-readable medium or memory for use by or in connection with an instruction execution system such as a processing component in a computer system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as magnetic, optical, or semiconductor media. More specific examples of a suitable computer-readable media include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described example(s) without departing substantially from the spirit and principles of the disclosure. All such modifications and variations are intended to be included herein within the scope of this disclosure and protected by the following claims.

What is claimed is:

1. A method of generating a three-dimensional room model, comprising:
   receiving a three-dimensional (3D) mesh data representing depth information of one or more surfaces and objects in a room;
   receiving plane data comprising a plurality of planes, wherein each plane of the plurality of planes represents a planar surface detected in the room during a scan of the room;
   determining a first top-down view of the 3D mesh data;
   generating a heat map representing a top-down view of vertical surfaces in the 3D mesh data;
   determining a first set of planes of the plurality of planes classified as wall planes;
   determining a second top-down view of the first set of planes;
   comparing the heat map to the second top-down view of the first set of planes;
   generating a second set of planes by extending at least one plane of the first set of planes to be commensurate with an overlapping vertical surface represented in the heat map;
   determining a first distance between a first plane of the second set of planes and a second plane of the second set of planes;

determining a first angle between the first plane and the second plane;

generating a third set of planes at least in part by deleting the second plane based on the first distance being less than a first threshold distance and the first angle being less than a first threshold angle; and generating the 3D room model based at least in part on the third set of planes.

2. The method of claim 1, further comprising:

determining a third plane of the third set of planes that is separated from a fourth plane by less than a second threshold distance;

determining that the third plane is perpendicular to the fourth plane to within a first tolerance; and generating the 3D room model further at least in part by extending the third plane to meet the fourth plane.

3. The method of claim 1, further comprising:

determining a third plane of the third set of planes that intersects with and extends beyond a fourth plane of the third set of planes;

separating the third plane into a first fragment located on a first side of the fourth plane and a second fragment located on a second side of the fourth plane;

determining that the second fragment does not meet any other plane apart from the fourth plane; and generating the 3D room model further at least in part by deleting the second fragment of the third plane.

4. A method, comprising:

receiving three-dimensional (3D) mesh data representing a room;

receiving plane data comprising a plurality of planes, wherein each plane of the plurality of planes represents a planar surface detected in the room;

determining a first plurality of wall candidates for a 3D model of the room based at least in part on the plane data;

determining a second plurality of wall candidates for the 3D model of the room by modifying the first plurality of wall candidates based on a comparison of the first plurality of wall candidates to the 3D mesh data and further based at least in part by extending a first length of a first wall candidate of the plane data to be commensurate with a second length of a vertical surface represented in the 3D mesh data; and generating the 3D model of the room based at least in part on the second plurality of wall candidates.

5. The method of claim 4, further comprising:

determining a first wall candidate of the first plurality of wall candidates that does not fully extend from a floor plane represented in the plane data to a ceiling plane represented in the plane data; and determining the second plurality of wall candidates based at least in part by extending the first wall candidate to fully extend from the floor plane to the ceiling plane.

6. The method of claim 4, further comprising:

determining a first distance between a first wall candidate of the first plurality of wall candidates and a second wall candidate of the first plurality of wall candidates; and determining the second plurality of wall candidates at least in part by deleting the first wall candidate based at least in part on the first distance being less than a threshold distance.

7. The method of claim 6, further comprising:

determining an angle between a first wall candidate of the first plurality of wall candidates and a second wall candidate of the first plurality of wall candidates; and determining the second plurality of wall candidates at least in part by deleting the first wall candidate based at least in part on the first distance being less than the threshold distance and the angle being less than a threshold angle.

8. The method of claim 4, further comprising:

generating a heat map at least in part by dividing a top-down view of the 3D mesh data into a plurality of grid cells; and generating, for a first grid cell of the plurality of grid cells, a first score based at least in part on a presence of first surfaces classified in the 3D mesh data as walls, second surfaces classified in the 3D mesh data as windows, and third surfaces classified in the 3D mesh data as doors.

9. The method of claim 8, further comprising:

determining a first score for a first plane of the plane data based at least in part by overlaying the heat map over a top-down view of the plane data, wherein the first score is determined at least in part by adding scores of grid cells through which the first plane passes.

10. The method of claim 9, further comprising:

determining a second score for a second plane of the plane data; and determining the second plurality of wall candidates based at least in part by deleting the second plane of the plane data based at least in part on the first score and the second score.

11. The method of claim 4, further comprising:

determining a first plane of the plane data that is separated from a second plane by less than a first threshold distance;

determining that the first plane is perpendicular to the second plane to within a first tolerance; and determining the second plurality of wall candidates at least in part by extending the first plane to meet the second plane.

12. A system comprising:

at least one processor; and non-transitory computer-readable memory storing instructions that, when executed by the at least one processor, are effective to:

receive three-dimensional (3D) mesh data representing a room;

receive plane data comprising a plurality of planes, wherein each plane of the plurality of planes represents a planar surface detected in the room;

determine a first plurality of wall candidates for a 3D model of the room based at least in part on the plane data;

determine a second plurality of wall candidates for the 3D model of the room by modifying the first plurality of wall candidates based on a comparison of the first plurality of wall candidates to the 3D mesh data and further based at least in part by extending a first length of a first wall candidate of the plane data to be commensurate with a second length of a vertical surface represented in the 3D mesh data; and generate the 3D model of the room based at least in part on the second plurality of wall candidates.

13. The system of claim 12, the non-transitory computer-readable memory storing further instructions that, when executed by the at least one processor, are further effective to:

determine a first wall candidate of the first plurality of wall candidates that does not fully extend from a floor plane represented in the plane data to a ceiling plane represented in the plane data; and determine the second plurality of wall candidates based at least in part by extending the first wall candidate to fully extend from the floor plane to the ceiling plane.

14. The system of claim 12, the non-transitory computer-readable memory storing further instructions that, when executed by the at least one processor, are further effective to:
   determine a first distance between a first wall candidate of the first plurality of wall candidates and a second wall candidate of the first plurality of wall candidates; and
   determine the second plurality of wall candidates at least in part by deleting the first wall candidate based at least in part on the first distance being less than a threshold distance.

15. The system of claim 14, the non-transitory computer-readable memory storing further instructions that, when executed by the at least one processor, are further effective to:
   determine an angle between a first wall candidate of the first plurality of wall candidates and a second wall candidate of the first plurality of wall candidates; and
   determine the second plurality of wall candidates at least in part by deleting the first wall candidate based at least in part on the first distance being less than the threshold distance and the angle being less than a threshold angle.

16. The system of claim 12, the non-transitory computer-readable memory storing further instructions that, when executed by the at least one processor, are further effective to:
   generate a heat map at least in part by dividing a top-down view of the 3D mesh data into a plurality of grid cells; and
   generate, for a first grid cell of the plurality of grid cells, a first score based at least in part on a presence of first surfaces classified in the 3D mesh data as walls, second surfaces classified in the 3D mesh data as windows, and third surfaces classified in the 3D mesh data as doors.

17. The system of claim 16, the non-transitory computer-readable memory storing further instructions that, when executed by the at least one processor, are further effective to:
   determine a first score for a first plane of the plane data based at least in part by overlaying the heat map over a top-down view of the plane data, wherein the first score is determined at least in part by adding scores of grid cells through which the first plane passes.

18. The system of claim 17, the non-transitory computer-readable memory storing further instructions that, when executed by the at least one processor, are further effective to:
   determine a second score for a second plane of the plane data; and
   determine the second plurality of wall candidates based at least in part by deleting the second plane of the plane data based at least in part on the first score and the second score.

\* \* \* \* \*